(12) United States Patent
Honya et al.

(10) Patent No.: US 11,656,260 B2
(45) Date of Patent: May 23, 2023

(54) ELECTROMAGNETIC WAVE MEASUREMENT POINT CALCULATION PROGRAM AND RADIATION INTERFERENCE WAVE MEASUREMENT DEVICE

(71) Applicant: TDK CORPORATION, Tokyo (JP)

(72) Inventors: Tomohiro Honya, Tokyo (JP); Masataka Midori, Tokyo (JP); Hiroshi Kurihara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 75 days.

(21) Appl. No.: 17/435,979

(22) PCT Filed: Feb. 26, 2020

(86) PCT No.: PCT/JP2020/007667
§ 371 (c)(1),
(2) Date: Sep. 2, 2021

(87) PCT Pub. No.: WO2020/195473
PCT Pub. Date: Oct. 1, 2020

(65) Prior Publication Data
US 2022/0155358 A1     May 19, 2022

(30) Foreign Application Priority Data

Mar. 27, 2019   (JP) .............................. JP2019-060380

(51) Int. Cl.
*G01R 27/04*    (2006.01)
*G01R 29/10*    (2006.01)

(52) U.S. Cl.
CPC ................................ *G01R 29/105* (2013.01)

(58) Field of Classification Search
CPC ............ G01R 29/0814; G01R 29/0892; G01R 29/0878; G01R 29/105
See application file for complete search history.

(56) References Cited

U.S. PATENT DOCUMENTS

| | | | |
|---|---|---|---|
| 6,411,104 B1 * | 6/2002 | Uesaka .............. | G01R 29/0814 324/633 |
| 2010/0271262 A1 * | 10/2010 | Eibert .................... | G01R 29/10 342/360 |

(Continued)

FOREIGN PATENT DOCUMENTS

| JP | 2017-181104 A | 10/2017 |
|---|---|---|
| JP | 2019-164102 A | 9/2019 |

OTHER PUBLICATIONS

May 26, 2020 International Search Report issued in International Patent Application No. PCT/JP2020/007667.

*Primary Examiner* — Thang X Le
(74) *Attorney, Agent, or Firm* — Oliff PLC

(57) ABSTRACT

An electromagnetic wave measurement point calculation program causing a computer to execute: a correction coefficient calculating function of calculating a correction coefficient for which an interval of heights of an antenna satisfies a sampling theorem based on a relative positional relation between a test body including a radiation source radiating a radiation interference wave and the antenna performing measurement of at least one of an electric field and a magnetic field of the radiation interference wave and a reflection coefficient of the radiation interference wave on a floor face on which the test body is placed; and a measurement height calculating function of sequentially calculating the heights of the antenna in a case in which the measurement is performed using the correction coefficient.

17 Claims, 20 Drawing Sheets

(56) References Cited

U.S. PATENT DOCUMENTS

2015/0042309 A1* 2/2015 Kurihara ............ G01R 29/0871
  324/76.11
2017/0276712 A1 9/2017 Midori et al.
2019/0293702 A1 9/2019 Midori et al.
2020/0348410 A1* 11/2020 Smith .................... G01S 7/411

* cited by examiner

ELECTROMAGNETIC WAVE MEASUREMENT POINT CALCULATION PROGRAM AND RADIATION INTERFERENCE WAVE MEASUREMENT DEVICE

TECHNICAL FIELD

The present invention relates to an electromagnetic wave measurement point calculation program and a radiation interference wave measurement device.

Priority is claimed on Japanese Patent Application No. 2019-060380, filed Mar. 27, 2019, the content of which is incorporated herein by reference.

BACKGROUND ART

Electronic devices may radiate radiation interference waves that are electromagnetic waves affecting electronic devices and communication devices in the vicinity thereof. For this reason, at present, a radiation interference wave test for checking that the intensity of electric field of radiation interference waves are equal to or lower than an allowed value of standards set internationally needs to be performed before the electronic device is shipped to the market.

In a radiation interference wave test, an electric field intensity is measured using an antenna while a height of the antenna with reference to a radiation source of radiation interference waves and an azimuth of the antenna with reference to the radiation source are changed, and a position at which the electric field intensity is a maximum is retrieved. Then, the electric field intensity of radiation interference waves is measured at the position at which the electric field intensity is the maximum for a predetermined time, and it is checked whether or not a measured value of this electric field intensity is equal to or lower than an allowed value of standards that are set internationally.

As a device used for performing such a radiation interference wave test, for example, there is a radiation interference wave measurement device described in Patent Literature 1.

CITATION LIST

Patent Literature

[Patent Literature 1]
Japanese Unexamined Patent Application, First Publication No. 2017-181104

In order to retrieve a position at which the electric field intensity is a maximum, it is necessary to measure an electric field distribution with a height of the antenna and an angle of a turntable, at which a test body is placed, each being sequentially changed. For this reason, in a radiation interference wave test, it is necessary to measure an electric field intensity for each of measurement points of a huge number. For example, in the case of radiation interference wave measurement in which 30 MHz to 40 GHz, which is a frequency band of an information communication device, is a frequency range of a measurement target as an example, the height of the antenna needs to be changed in a range of 1 m to 4 m, and the angle of the turntable in which a test body is placed needs to be changed in a range of 0 degrees to 360 degrees. In such a case, when a radiation interference wave test is performed with the height of the antenna at 1 cm intervals and the angle of the turntable at 1 degree intervals, the number of measurement points is about 140,000, which is enormous, and a time required for performing the radiation interference wave test becomes very long.

In addition, in such a radiation interference wave test, it is necessary to detect a maximum electric field intensity position for a wide frequency band, and thus a spectrum analyzer that is able to measure a spectrum of a wide frequency band is used. Examples of such a spectrum analyzer include a spectrum analyzer of a superheterodyne reception device type and a spectrum analyzer of a fast Fourier transform (FFT) system. However, by measuring a spectrum of a wide frequency band, a time required for performing a radiation interference wave test becomes even longer.

In this way, an operation for retrieving a height of the antenna and an angle of the turntable at which the electric field intensity is a maximum requires a great deal of time. For this reason, the radiation interference wave measurement device disclosed in Patent Literature 1 measures an electric field intensity distribution of a radiation interference wave at each of measurement points set with a measurement interval equal to or smaller than half of the wavelength of the radiation interference wave and interpolates electric field intensities between such measurement points, thereby reducing the number of measurement points and shortening a time required for performing a radiation interference wave test.

However, the radiation interference wave measurement device disclosed in Patent Literature 1 does not perform optimization of the interval of measurement points, and thus a time required for performing a radiation interference wave test cannot be sufficiently shortened. In addition, in a case in which the frequency of the radiation interference wave is high, the wavelength of the radiation interference wave becomes short. For this reason, for example, in a case in which the frequency of the radiation interference wave is 10 GHz, a distance between the antenna and a test body in the horizontal direction is 3 m, and a radiation interference wave test is performed with the height of the antenna being changed in a range of 1 m to 4 m and the angle of the turntable, in which the test body is placed, being changed in a range of 0 degrees to 360 degrees, the number of measurement points is about 250,000, which is enormous, and a time required for performing a radiation interference wave test becomes very long.

SUMMARY OF INVENTION

Technical Problem

An object of the present invention is to provide an electromagnetic wave measurement point calculation program and a radiation interference wave measurement device capable of shortening a time required for performing a radiation interference wave test.

Solution to Problem

According to one aspect of the present invention, there is provided an electromagnetic wave measurement point calculation program causing a computer to execute: a correction coefficient calculating function of calculating a correction coefficient for which an interval of heights of an antenna satisfies a sampling theorem based on a relative positional relation between a test body including a radiation source radiating a radiation interference wave and the antenna performing measurement of at least one of an electric field and a magnetic field of the radiation interference wave and a reflection coefficient of the radiation interference wave on a floor face on which the test body is placed; and a measurement height calculating function of sequentially calculating the heights of the antenna in a case in which the measurement is performed using the correction coefficient.

In addition, in the aspect of the present invention, the correction coefficient calculating function is a function of calculating the correction coefficient using at least two of a shortest distance between the test body and the antenna in a horizontal direction, a longest distance between the test body and the antenna in the horizontal direction, a shortest distance from the floor face on which the test body is placed to the test body, and a longest distance from the floor face on which the test body is placed to the test body.

In addition, in the aspect of the present invention, the correction coefficient calculating function calculates the correction coefficient using the following equations Equation (1) or Equation (2) and Equation (3), and the measurement height calculating function sequentially calculates the heights of the antenna in a case in which the measurement is performed using the following equation, Equation (4).

[Math. 1]

$$K_{hmax}(h_{rx}) = \qquad (1)$$

$$\begin{cases} \dfrac{h_{rx} - h_{min}}{\sqrt{d_{max}^2 + (h_{rx} - h_{min})^2}} - \dfrac{h_{rx} - h_{max}}{\sqrt{d_{min}^2 + (h_{rx} - h_{max})^2}} (h_{rx} \le h_{min}) \\ \dfrac{h_{rx} - h_{min}}{\sqrt{d_{min}^2 + (h_{rx} - h_{min})^2}} - \dfrac{h_{rx} - h_{max}}{\sqrt{d_{min}^2 + (h_{rx} - h_{max})^2}} (h_{min} \le h_{rx} \le h_{max}) \\ \dfrac{h_{rx} - h_{min}}{\sqrt{d_{min}^2 + (h_{rx} - h_{min})^2}} - \dfrac{h_{rx} - h_{max}}{\sqrt{d_{max}^2 + (h_{rx} - h_{max})^2}} (h_{rx} \ge h_{max}) \end{cases}$$

[Math. 2]

$$K_{hmax}(h_{rx}) = \qquad (2)$$

$$\begin{cases} \dfrac{h_{rx} + h_{max}}{\sqrt{d_{max}^2 + (h_{rx} + h_{max})^2}} - \dfrac{h_{rx} - h_{max}}{\sqrt{d_{min}^2 + (h_{rx} - h_{max})^2}} (h_{rx} \le h_{min}) \\ \dfrac{h_{rx} + h_{max}}{\sqrt{d_{min}^2 + (h_{rx} + h_{max})^2}} - \dfrac{h_{rx} - h_{max}}{\sqrt{d_{min}^2 + (h_{rx} - h_{max})^2}} (h_{min} \le h_{rx} \le h_{max}) \\ \dfrac{h_{rx} + h_{max}}{\sqrt{d_{min}^2 + (h_{rx} + h_{max})^2}} - \dfrac{h_{rx} - h_{max}}{\sqrt{d_{max}^2 + (h_{rx} - h_{max})^2}} (h_{rx} \ge h_{max}) \end{cases}$$

[Math. 3]

$$\Delta h_{rx}(h_{rx}) \le \dfrac{\lambda}{2K_{hmax}} \qquad (3)$$

$K_{hmax}$: Correction coefficient
$h_{rx}$: Height of antenna
$d_{min}$: Shortest distance between test body and antenna in horizontal direction
$d_{max}$: Longest distance between test body and antenna in horizontal direction
$h_{min}$: Shortest distance from floor face on which test body is placed to test body
$h_{max}$: Longest distance from floor face on which test body is placed to test body
$\Delta h_{rx}$: Amount of change of height of antenna

[Math. 4]

$$h_{rx,0} = h_{rx\_min}$$

$$h_{rx,1} = h_{rx\_min} + \Delta h_{rx}(h_{rx,0})$$

$$h_{rx,k} = h_{rx,k-1} + \Delta h_{rx}(h_{rx,k-1}) (k \ge 2) \qquad (4)$$

$h_{rx\_min}$: Minimum value of height of antenna

In addition, in the aspect of the present invention, the electromagnetic wave measurement point calculation program causing the computer to further execute a judgment function of judging whether or not the radiation interference wave reflected on the floor face needs to be taken into account, in which the correction coefficient calculating function calculates the correction coefficient using Equation (1) in a case in which it is judged that the radiation interference wave reflected on the floor face does not need to be taken into account.

In addition, in the aspect of the present invention, the electromagnetic wave measurement point calculation program causing the computer to further execute a judgment function of judging whether or not the radiation interference wave reflected on the floor face needs to be taken into account, in which the correction coefficient calculating function calculates the correction coefficient using Equation (2) or stops calculation of the correction coefficient in a case in which it is judged that the radiation interference wave reflected on the floor face needs to be taken into account.

In addition, in the aspect of the present invention, the correction coefficient calculating function calculates the correction coefficient using Equation (2) regardless of whether or not the radiation interference wave reflected on the floor face needs to be taken into account.

In addition, in the aspect of the present invention, the electromagnetic wave measurement point calculation program causes the computer to further execute: a first electromagnetic field distribution acquiring function of acquiring a first electromagnetic field distribution that is a distribution of at least one of the electric field and the magnetic field of the radiation interference wave and is acquired through a simulation or actual measurement; and a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter, in which the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face does not need to be taken into account in a case in which the deviation is equal to or smaller than a predetermined allowed value.

In addition, in the aspect of the present invention, the electromagnetic wave measurement point calculation program causes the computer to further execute: a first electromagnetic field distribution acquiring function of acquiring a first electromagnetic field distribution that is a distribution of at least one of the electric field and the magnetic field of the radiation interference wave and is acquired through a simulation or actual measurement; and a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter, in which the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face needs to be taken into account in a case in which the deviation exceeds a predetermined allowed value.

In addition, in the aspect of the present invention, the electromagnetic wave measurement point calculation program causes the computer to further execute: a first electromagnetic field distribution acquiring function of acquiring a first electromagnetic field distribution that is a distribution of at least one of the electric field and the magnetic field of the radiation interference wave and is acquired through a simulation or actual measurement; and a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter, in which the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face does not need to be taken into account in a case in which the deviation corresponds to the reflection coefficient that is equal to or smaller than a predetermined threshold.

In addition, in the aspect of the present invention, the electromagnetic wave measurement point calculation program causes the computer to further execute: a first electromagnetic field distribution acquiring function of acquiring a first electromagnetic field distribution that is a distribution of at least one of the electric field and the magnetic field of the radiation interference wave and is acquired through a simulation or actual measurement; and a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter, in which the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face needs to be taken into account in a case in which the deviation corresponds to the reflection coefficient that exceeds a predetermined threshold.

In addition, in the aspect of the present invention, the judgment function is a function of judging that the radiation interference wave reflected on the floor face does not need to be taken into account in a case in which the reflection coefficient, a frequency of the radiation interference wave, and a sampling frequency calculated from a maximum frequency of the radiation interference wave satisfy the following Equation (5).

[Math. 5]

$$-20\log_{10}\Gamma \geq 24 \cdot f/f_{max}+16(0<f/f_{max}\leq 1) \qquad (5)$$

In addition, in the aspect of the present invention, the judgment function is a function of judging that the radiation interference wave reflected on the floor face needs to be taken into account in a case in which the reflection coefficient, a frequency of the radiation interference wave, and a sampling frequency calculated from a maximum frequency of the radiation interference wave do not satisfy the following Equation (6).

[Math. 6]

$$-20\log_{10}\Gamma \geq 24 \cdot f/f_{max}+16(0<f/f_{max}\leq 1) \qquad (6)$$

In addition, in the aspect of the present invention, the judgment function is a function of judging that the radiation interference wave reflected on the floor face does not need to be taken into account in a case in which an absorption characteristic of the floor face for a frequency of the radiation interference wave of which at least one of an electric field and a magnetic field is measured satisfies the following Equation (7).

[Math. 7]

$$\text{Absorption characteristic (dB)} \geq -20\log_{10}\Gamma \qquad (7)$$

In addition, in the aspect of the present invention, the judgment function is a function of judging that the radiation interference wave reflected on the floor face needs to be taken into account in a case in which an absorption characteristic of the floor face for a frequency of the radiation interference wave of which at least one of an electric field and a magnetic field is measured does not satisfy the following Equation (8).

[Math. 8]

$$\text{Absorption characteristic (dB)} \geq -20\log_{10}\Gamma \qquad (8)$$

In addition, in the aspect of the present invention, the judgment function is a function of judging that the radiation interference wave reflected on the floor face does not need to be taken into account in a case in which an electric wave absorber, of which a height with reference to the floor face is equal to or larger than a value of a larger one of $0.45\lambda_{min}$ and $2.8\lambda_{max}$, is provided on the floor face.

In addition, in the aspect of the present invention, the judgment function is a function of judging that the radiation interference wave reflected on the floor face needs to be taken into account in a case in which an electric wave absorber, of which a height with reference to the floor face is smaller than a value of a larger one of $0.45\lambda_{min}$ and $2.8\lambda_{max}$, is provided on the floor face or in a case in which no electric wave absorber is provided on the floor face.

In addition, according to one aspect of the present invention, there is provided a radiation interference wave measurement device including a computer configured to execute any one of the electromagnetic wave measurement point calculation programs described above.

Advantageous Effects of Invention

According to the present invention, a time required for performing a radiation interference wave test can be shortened.

DESCRIPTION OF EMBODIMENTS

Embodiment

Figure 1:
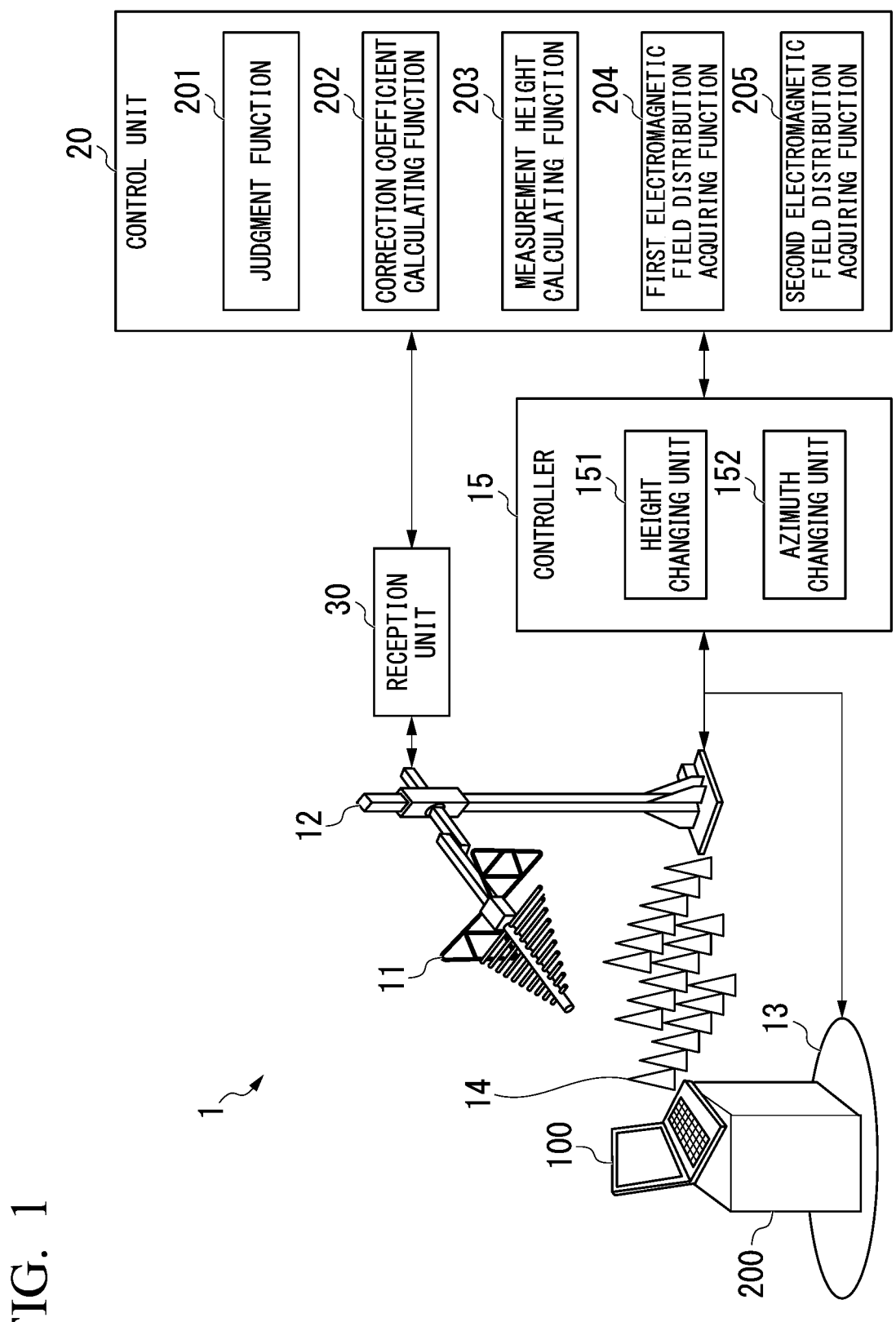
FIG. 1 is a diagram illustrating an example of the configuration of a radiation interference wave measurement device according to an embodiment.

A radiation interference wave measurement device according to an embodiment will be described with reference to FIGS. 1 to 21. FIG. 1 is a diagram illustrating an example of the configuration of a radiation interference wave measurement device according to an embodiment.

The radiation interference wave measurement device 1 illustrated in FIG. 1 is a device used for a radiation interference wave test for measuring a radiation interference wave radiating from a test body 100 that is a test body, for example, in accordance with EMC standards. In this radiation interference wave test, test conditions and a test method are internationally set. The radiation interference wave measurement device 1 is disposed inside an anechoic chamber including a metal floor face that forms a ground plane. An electric wave absorber is attached to each of wall faces except for the metal floor face among inner walls of the anechoic chamber. In addition, for example, the test body 100 is an electronic device and includes a radiation source that radiates a radiation interference wave.

As illustrated in FIG. 1, the radiation interference wave measurement device 1 includes an antenna 11, an antenna mast 12, a turntable 13, electric wave absorbers 14, a controller 15, a control unit 20, and a reception unit 30.

Figure 2:
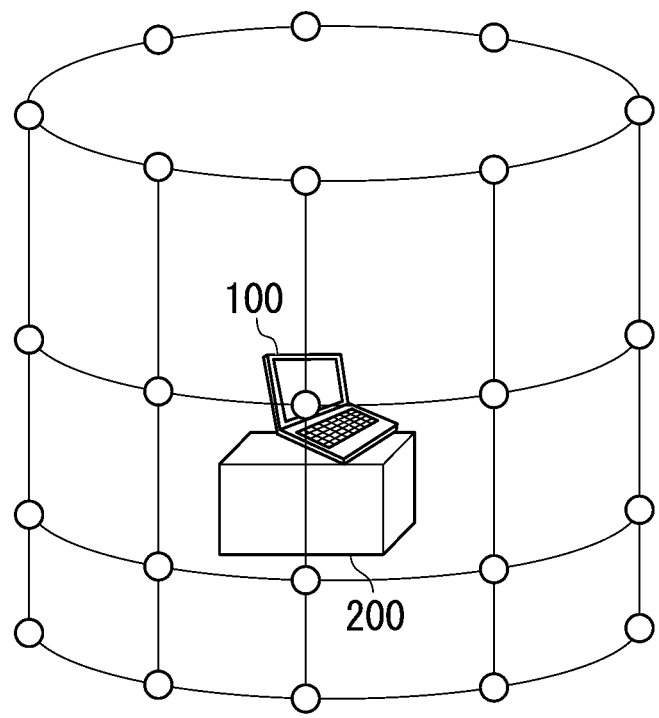
FIG. 2 is a diagram illustrating an example of measurement points positioned on a face that surrounds a test body according to an embodiment.

The antenna 11 receives a radiation interference wave of a predetermined frequency band at a measurement point positioned on a face surrounding the test body 100. FIG. 2 is a diagram illustrating an example of measurement points positioned on a face that surrounds a test body according to an embodiment. For example, this face has a center axis perpendicular to a ground plane and is a side face of a cylinder including a test body 100 and a stand 200 inside. As denoted by white circles in FIG. 2, each measurement point is disposed on two-dimensional orthogonal coordinates defined by a first axis along a circumferential direction of the circle of a bottom face of the cylinder and a second axis that is an axis parallel to the center axis of the cylinder. The first axis represents a height of each measurement point with reference to the test body 100. The second axis represents an angle of each measurement point with reference to the test body 100. The measurement points illustrated in FIG. 2 are disposed at equal intervals in a direction parallel to the first axis and a direction parallel to the second axis. However, the measurement points illustrated in FIG. 2 may be disposed at arbitrary intervals in at least one of the direction parallel to the first axis and the direction parallel to the second axis.

The antenna mast 12 supports the antenna 11 in a form in which the antenna 11 can be lifted or lowered and is disposed to have a predetermined gap from the test body 100. The turntable 13 is a disc-shaped turntable disposed on the ground plane and can rotate around an axis vertical to the ground plane as its center. The test body 100 is placed on the stand 200 that is placed in the turntable 13. The electric wave absorber 14 is a pyramid-shaped structure provided on the ground plane and is produced using a material that absorbs a radiation interference wave, for example, a forming material.

The controller 15 includes a height changing unit 151 and an azimuth changing unit 152. The height changing unit 151 performs a height changing process of changing a height of the antenna 11, which receives a radiation interference wave radiated by the test body 100, with reference to the test body 100. More specifically, the height changing unit 151 lifts the antenna 11 by driving the antenna mast 12 and fixes the antenna 11 at a predetermined height. The azimuth changing unit 152 performs an azimuth changing process of changing an azimuth of the antenna 11 with reference to the test body 100. More specifically, after the antenna 11 is fixed to a predetermined height by the height changing unit 151, the azimuth changing unit 152 rotates the test body 100 and the stand 200 by 360 degrees by driving the turntable 13.

The control unit 20 has a judgment function 201, a correction coefficient calculating function 202, a measurement height calculating function 203, a first electromagnetic field distribution acquiring function 204, and a second electromagnetic field distribution acquiring function 205.

The judgment function 201 is a function for judging whether or not a radiation interference wave reflected on the floor face needs to be take into account. A specific example of a case in which the judgment function 201 judges that a radiation interference wave reflected on the floor face does not need to be taken into account and a specific example of a case in which it is judged that a radiation interference wave reflected on the floor face needs to be taken into account will be described below.

The correction coefficient calculating function 202 is a function for calculating a correction coefficient for which an interval of the height of the antenna 11 satisfies a sampling theorem based on a positional relation between the test body 100 including a radiation source radiating a radiation interference wave and the antenna 11 measuring an electric field intensity of the radiation interference wave, and a reflection coefficient of the radiation interference wave on the floor face on which the test body 100 is placed. More specifically, the correction coefficient calculating function 202 uses at least two of a shortest distance between the test body 100 and the antenna 11 in a horizontal direction, a longest distance between the test body 100 and the antenna 11 in the horizontal direction, a shortest distance from the floor face on which the test body 100 is placed to the test body 100, and a longest distance from the floor face on which the test body 100 is placed to the test body 100 as a relative positional relation between the test body 100 and the antenna 11. For example, the correction coefficient calculating function 202 calculates a correction coefficient based on a principle described below.

An electric field E at an arbitrary point is represented in the following Equation (9).

[Math. 9]

$$E = \sum_{n=1}^{N} (a_n + jb_n)\exp(jkr_n) \quad (9)$$

The square of the electric field intensity can be represented in the following Equation (10) when Equation (9) is taken into account. Equation (10) includes arguments n and m representing radiation sources, distances $r_n$ and $r_m$ between the antenna 11 and the radiation sources, coefficients $a_n$, $a_m$, $b_n$, and $b_m$, the number of waves k, and the number N of test bodies 100. In addition, Equation (10) represents that the electric field intensity is a sum of sinusoidal waves of which intensities oscillate with respect to $r_n - r_m$.

[Math. 10]

$$\begin{aligned}|E|^2 &= \left|\sum_{n=1}^{N}(a_n + jb_n)\exp(jkr_n)\right|^2 \\ &= \left(\sum_{n=1}^{N} a_n\cos(kr_n) - b_n\sin(kr_n)\right)^2 + \\ &\quad \left(\sum_{n=1}^{N} a_n\sin(kr_n) + b_n\cos(kr_n)\right)^2 \\ &= \sum_{m=1}^{N}\sum_{n=1}^{N}(a_n\cos(kr_n) - b_n\sin(kr_n))\cdot(a_m\cos(kr_m) - b_m\sin(kr_m)) + \\ &\quad (a_n\sin(kr_n) + b_n\cos(kr_n))\cdot(a_m\sin(kr_m) + b_m\cos(kr_m)) \\ &= \sum_{m=1}^{N}\sum_{n=1}^{N}(a_na_m + b_mb_n)\cos(k(r_n - r_m)) + \\ &\quad (a_nb_m - a_mb_n)\sin(k(r_n - r_m))\end{aligned} \quad (10)$$

In addition, the number of waves k is acquired by dividing $2\pi$ by a measurement frequency. For this reason, by measuring an electric field intensity of a radiation interference wave at an interval satisfying the condition of the following Equation (11) based on the sampling theorem, the radiation interference wave measurement device 1 can completely reproduce an electric field intensity distribution. Here, $\lambda$ is a wavelength of the radiation interference wave of which an electric field intensity is measured by the radiation interference wave measurement device 1.

[Math. 11]

$$\Delta(r_n - r_m) \le \frac{\lambda}{2} \quad (11)$$

When the distances $r_n$ and $r_m$ between the antenna 11 and the radiation sources are represented as functions of a height $h_{rx}$ of the antenna 11, the following Equations (12) and (13) are acquired. Equation (12) represents that the distance $r_n$ between the antenna 11 and the radiation source n can be represented using a distance $d_n$ between the antenna 11 and the radiation source n in the horizontal direction, a position $h_n$ of the radiation source n in the height direction, and the height $h_{rx}$ of the antenna 11. Similarly, Equation (13) represents that the distance $r_m$ between the antenna 11 and the radiation source m can be represented using a distance $d_m$ between the antenna 11 and the radiation source m in the horizontal direction, a position $h_m$ of the radiation source m in the height direction, and the height $h_{rx}$ of the antenna 11.

[Math. 12]

$$r_n = \sqrt{d_n^2 + (H_{rx} - h_n)^2} \quad (12)$$

[Math. 13]

$$r_m = \sqrt{d_m^2 + (h_{rx} - h_m)^2} \quad (13)$$

In addition, the position $h_n$ of the radiation source n in the height direction and the position $h_m$ of the radiation source m in the height direction take positive/negative values in accordance with a principle of reflection in a case in which there is a radiation interference wave reflected on the floor face and take only positive values in a case in where there is no radiation interference wave reflected on the floor face. In description presented below, it is assumed that the position $h_n$ of the radiation source n in the height direction is lower than the position $h_m$ of the radiation source m in the height direction.

A relation between an amount of change $\Delta(r_n - r_m)$ of $r_n - r_m$ and the height $h_{rx}$ of the antenna can be represented using the following Equations (14) and (15). Here, $\Delta h_{rx}$ is an amount of change of the height $h_{rx}$ of the antenna. In addition, $K_h$ is a correction coefficient.

[Math. 14]

$$\Delta(r_i - r_j) = \frac{\partial(r_i - r_j)}{\partial h_{rx}}\Delta h_{rx} = K_h \Delta h_{rx} \quad (14)$$

[Math. 15]

$$K_h = \frac{h_{rx} - h_n}{\sqrt{d_n^2 + (h_{rx} - h_n)^2}} - \frac{h_{rx} - h_m}{\sqrt{d_m^2 + (h_{rx} - h_m)^2}} \quad (15)$$

In addition, the following Equations (16), (17), (18), and (19) are satisfied.

[Math. 16]

$$\frac{\partial K_h}{\partial h_n} \le 0, \frac{\partial K_h}{\partial h_m} \ge 0 \quad (16)$$

[Math. 17]

$$\frac{\partial K_h}{\partial d_n} \ge 0, \frac{\partial K_h}{\partial d_m} \le 0 \, (h_x \le h_n,\ h_{rx} \le h_m) \quad (17)$$

[Math. 18]

$$\frac{\partial K_h}{\partial d_n} \le 0, \frac{\partial K_h}{\partial d_m} \le 0 \, (h_{rx} \ge h_n,\ h_{rx} \le h_m) \quad (18)$$

[Math. 19]

$$\frac{\partial K_h}{\partial d_n} \le 0, \frac{\partial K_h}{\partial d_m} \ge 0 \, (h_{rx} \ge h_n,\ h_{rx} \le h_m) \quad (19)$$

By using Equations (16), (17), (18), and (19) with the size of the test body 100 being taken into account, the following Equation (20) is formed.

[Math. 20]

$$K_{hmax}(h_{rx}) \leq \begin{cases} \dfrac{h_{rx} - h_{min}}{\sqrt{d_{max}^2 + (h_{rx} - h_{min})^2}} - \dfrac{h_{rx} - h_{max}}{\sqrt{d_{min}^2 + (h_{rx} - h_{max})^2}} & (h_{rx} \leq h_{min}) \\ \dfrac{h_{rx} - h_{min}}{\sqrt{d_{min}^2 + (h_{rx} - h_{min})^2}} - \dfrac{h_{rx} - h_{max}}{\sqrt{d_{min}^2 + (h_{rx} - h_{max})^2}} & (h_{min} \leq h_{rx} \leq h_{max}) \\ \dfrac{h_{rx} - h_{min}}{\sqrt{d_{min}^2 + (h_{rx} - h_{min})^2}} - \dfrac{h_{rx} - h_{max}}{\sqrt{d_{max}^2 + (h_{rx} - h_{max})^2}} & (h_{rx} \geq h_{max}) \end{cases} \quad (20)$$

In addition, in a case in which an interval of the height of the antenna 11 measuring an electric field intensity of a radiation interference wave radiated from a radiation source included in the test body 100 satisfies the following Equation (21), the sampling theorem is satisfied.

[Math. 21]

$$\Delta h_{rx}(h_{rx}) \leq \frac{\lambda}{2K_{hmax}} \quad (21)$$

In addition, the following Equation (22) describing features relating to a direction in which a radiation source included in the test body 100 radiates a radiation interference wave needs to be satisfied. Equation (22) is an equation acquired when a case in which the number of waves k is zero, and the coefficients $a_n$, $a_m$, $b_n$, and $b_m$ included in Equation (9) described above are trigonometric functions is taken into account. Here, $h_{rx\_min}$ is a minimum value of the height of the antenna 11.

[Math. 22]

$$\arctan\left(\frac{h_{rx\_min} + h_{min}}{d_{min}}\right) \leq \frac{\pi}{4} \quad (22)$$

Until this point, a case in which there is no radiation interference wave reflected on the floor face has been described. On the other hand, in a case in which there is a radiation interference wave reflected on the floor face, by considering that the position ha of the radiation source n in the height direction and the position $h_m$ of the radiation source m in the height direction may take not only positive values but also negative values, a correction coefficient $K_{hmax}$ can be calculated under the conditions of Equations (16), (17), (18), and (19). By considering the corresponding conditions, the following Equation (23) acquired by substituting $h_{min}$ included in Equation (20) described above with $-h_{max}$ is formed.

[Math. 23]

$$K_{hmax}(h_{rx}) \leq \quad (23)$$
$$\begin{cases} \dfrac{h_{rx} + h_{max}}{\sqrt{d_{max}^2 + (h_{rx} + h_{max})^2}} - \dfrac{h_{rx} - h_{max}}{\sqrt{d_{min}^2 + (h_{rx} - h_{max})^2}} & (h_{rx} \leq h_{min}) \\ \dfrac{h_{rx} + h_{max}}{\sqrt{d_{min}^2 + (h_{rx} + h_{max})^2}} - \dfrac{h_{rx} - h_{max}}{\sqrt{d_{min}^2 + (h_{rx} - h_{max})^2}} & (h_{min} \leq h_{rx} \leq h_{max}) \\ \dfrac{h_{rx} + h_{max}}{\sqrt{d_{min}^2 + (h_{rx} + h_{max})^2}} - \dfrac{h_{rx} - h_{max}}{\sqrt{d_{max}^2 + (h_{rx} - h_{max})^2}} & (h_{rx} \geq h_{max}) \end{cases}$$

In other words, in a case in which there is no radiation interference wave reflected on the floor face, the correction coefficient calculating function 202 calculates a correction coefficient $K_{hmax}$ using Equation (20) described above. In a case in which there is a radiation interference wave reflected on the floor face, it is preferable to calculate a correction coefficient $K_{hmax}$ using Equation (23) described above. In other words, in a case in which it is judged that a radiation interference wave reflected on the floor face does not need to be taken into account using the judgment function 201, it is preferable that the correction coefficient calculating function 202 calculate a correction coefficient using Equation (20). Similarly, in a case in which it is judged that a radiation interference wave reflected on the floor face needs to be taken into account using the judgment function 201, it is preferable that the correction coefficient calculating function 202 calculates a correction coefficient using Equation (23).

The measurement height calculating function 203 sequentially calculates heights of the antenna 11 in a case in which measurement is performed using the correction coefficient $K_{hmax}$ calculated by the correction coefficient calculating function 202. More specifically, the measurement height calculating function 203 sequentially calculates heights of the antenna 11 in a case in which measurement is performed using the following Equation (24).

[Math. 24]

$$\begin{cases} h_{rx,0} = h_{rx\_min} \\ h_{rx,1} = h_{rx\_min} + \Delta h_{rx}(h_{rx,0}) \\ h_{rx,k} = h_{rx,k-1} + \Delta h_{rx}(h_{rx,k-1}) \ (k \geq 2) \end{cases} \quad (24)$$

In other words, the measurement height calculating function 203 calculates an interval $\Delta h_{rx}(h_{rx})$ of the height of the antenna 11 in a case in which measurement is performed such that $K_{hmax}\Delta h_{rx}(h_{rx})$ is constant by using Equations (20), (21), and (22) described above or by using Equations (23), (21), and (22) described above. Then, the measurement height calculating function 203 calculates a height of each measurement point using Equation (24).

Next, a specific example of a case in which the judgment function 201 judges that a radiation interference wave reflected on the floor face does not need to be taken into account and a specific example of a case in which it is judged that a radiation interference wave reflected on the floor face needs to be taken into account will be described.

The first electromagnetic field distribution acquiring function 204 acquires a first electric field distribution, which is an electric field intensity distribution from a radiation interference wave or a radiation source set with a radiation interference wave taken into account, that is acquired through a simulation or actual measurement.

The second electromagnetic field distribution acquiring function 205 acquires an electric field intensity at the height of the antenna 11 calculated by the measurement height calculating function 203 from the first electric field intensity distribution and acquires a second electric field distribution acquired by interpolating electric field intensities at heights of the antenna 11 that are different from the height of the antenna 11 calculated by the measurement height calculating function 203 using a lowpass filter.

Figure 3:
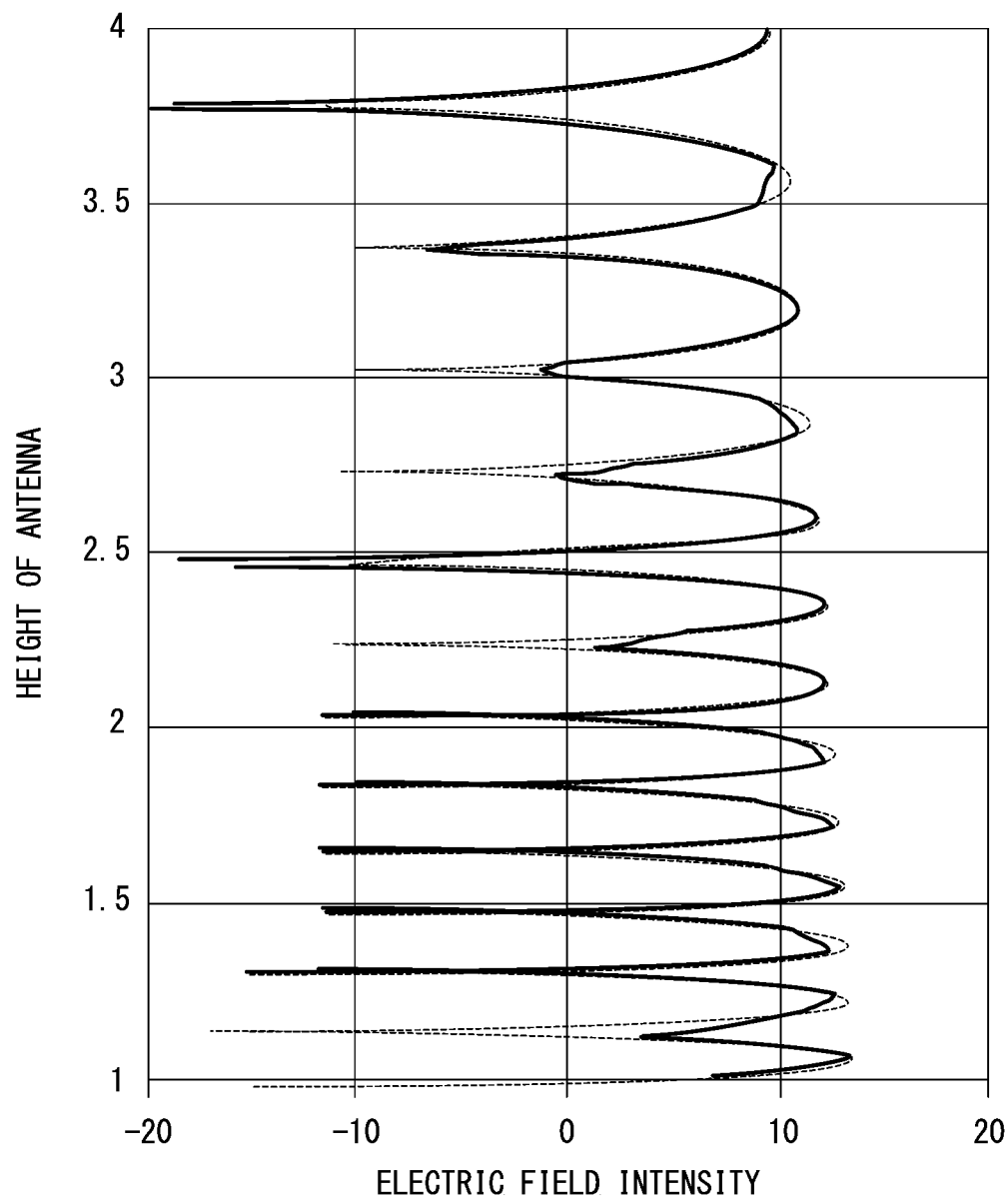
FIG. 3 is a diagram illustrating an example of a first electric field distribution reproduced through a simulation and a second electric field distribution acquired by performing interpolation by applying a lowpass filter to the first electric field intensity distribution in a case in which a size of a test body according to an embodiment in a height direction is 100 cm, and a shortest distance from a floor face to the test body is 10 cm.

FIG. 3 is a diagram illustrating an example of a first electric field distribution reproduced through a simulation or actual measurement and a second electric field distribution acquired by performing interpolation by applying a lowpass filter to the first electric field intensity distribution in a case in which a size of a test body according to an embodiment in a height direction is 100 cm, and a shortest distance from a floor face to the test body is 10 cm. This first electric field distribution is a distribution acquired through a simulation or actual measurement performed under an assumption that one test body 100 is disposed at each of a highest position and a lowest position of the height dimension of the test body 100 among test bodies 100, and there are radiation sources having the same amplitudes and the same phases of radiated radiation interference waves. In FIG. 3, a dotted line represents the first electric field distribution. In FIG. 3, a solid line represents the second electric field distribution.

In any one of the first electric field distribution and the second electric field distribution, the electric field intensity is plotted with an interval of the height of the antenna 11 as 1 cm. In the second electric field intensity distribution, results of simulations or actual measurement of the first electric field distribution are used only for 43 points, and interpolation is performed by applying a lowpass filter for the other measurement points.

When the first electric field distribution denoted by the dotted line in FIG. 3 and the second electric field distribution denoted by the solid line in FIG. 3 are compared with each other, it can be understood that heights of peaks and heights of null points are well reproduced. Here, a null point represents a height of the antenna 11 at which the electric field intensity is a minimum. In addition, when both the distributions are compared with each other, it can be understood that also the magnitude of the electric field intensity at the height of the peak is well reproduced. Thus, it can be considered that the second electric field distribution is sufficiently reliable. Furthermore, when both distributions are compared with each other, although there are spots at which the magnitude of the electric field intensity at a null point is not sufficiently reproduced, the magnitude of the electric field intensity at a null point is not used in a radiation interference wave test, and thus, particularly, there is no problem.

Figure 4:
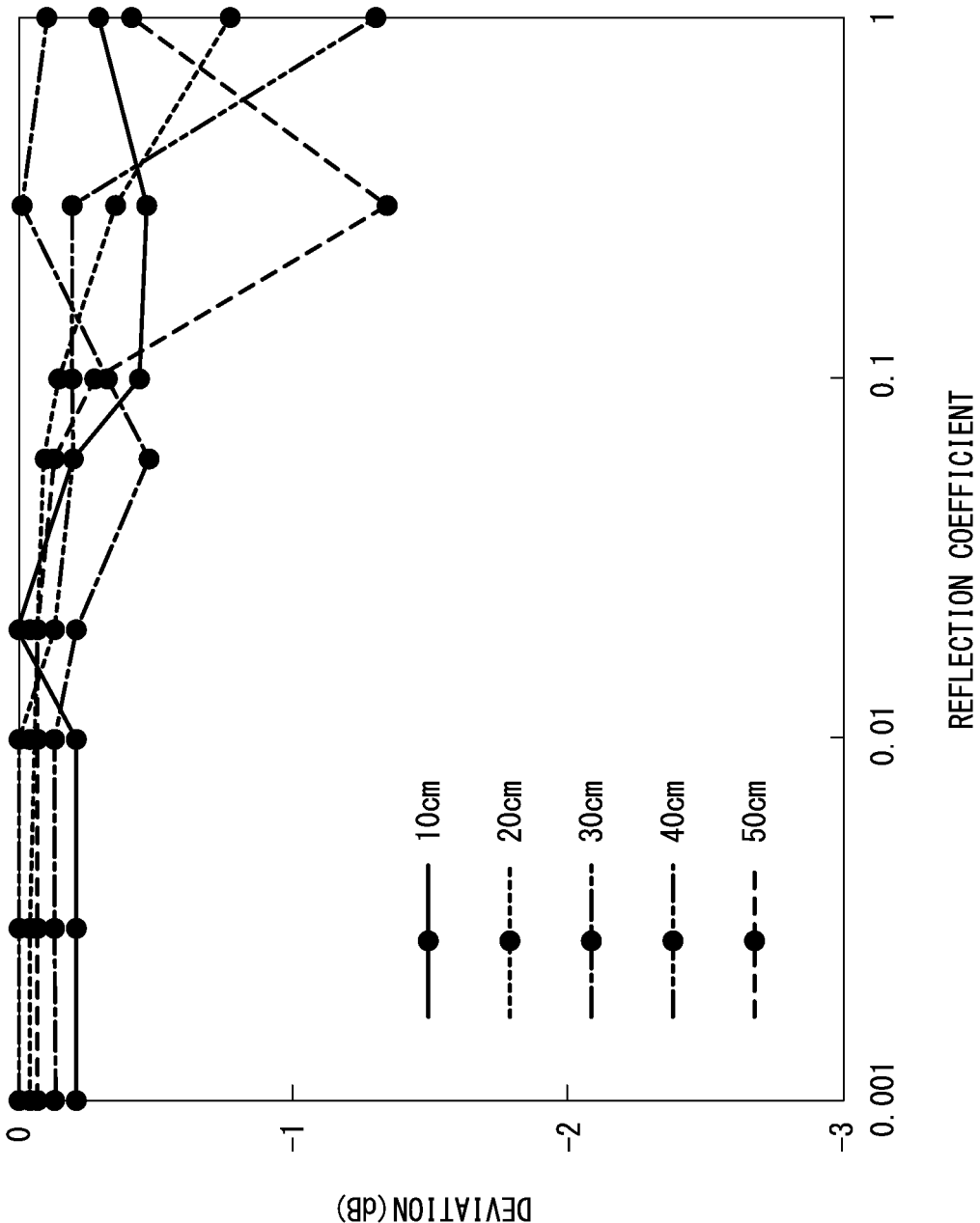
FIG. 4 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 6 GHz, and the radiation interference wave is a horizontally-polarized wave.
Figure 5:
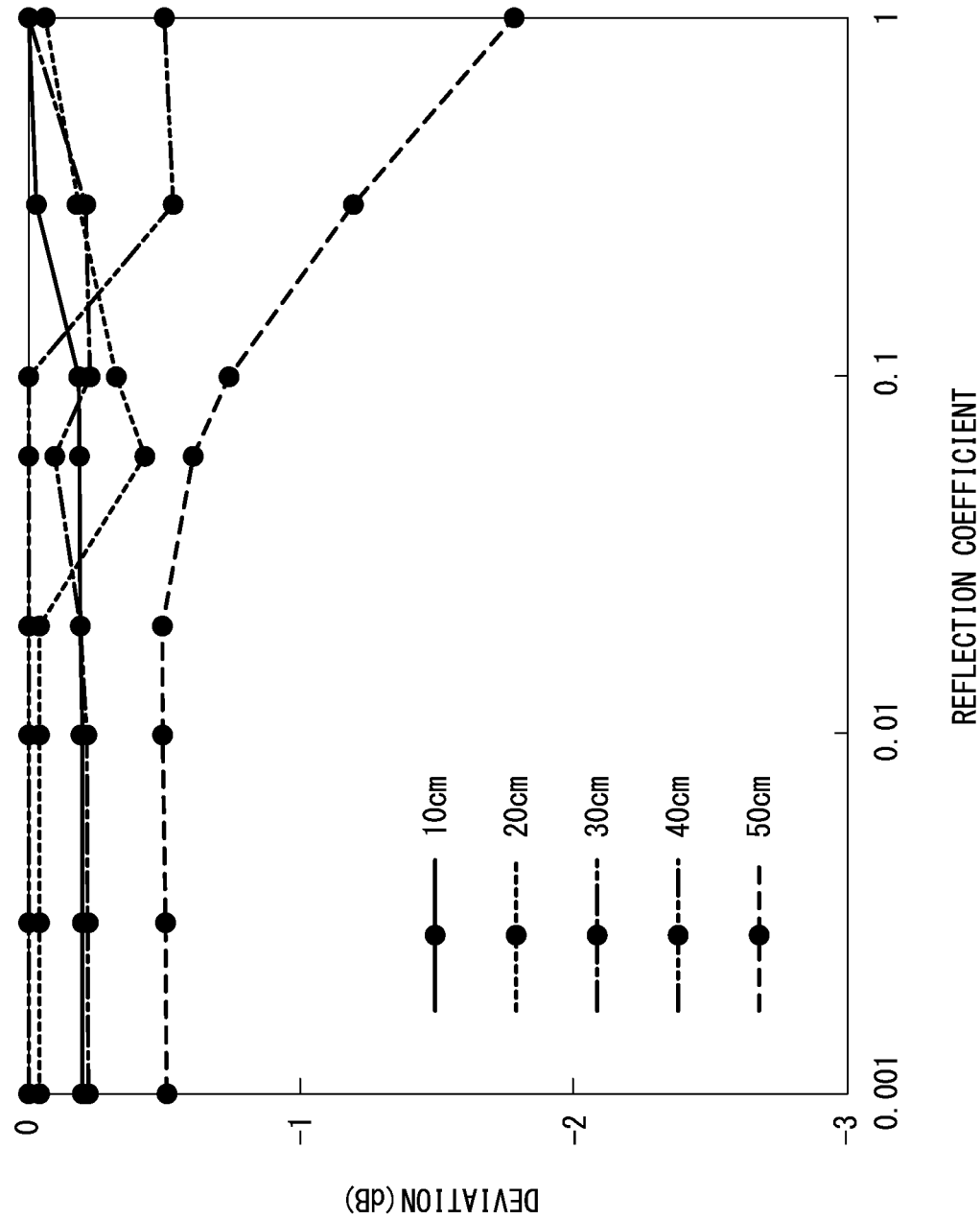
FIG. 5 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 6 GHz, and the radiation interference wave is a vertically-polarized wave.
Figure 6:
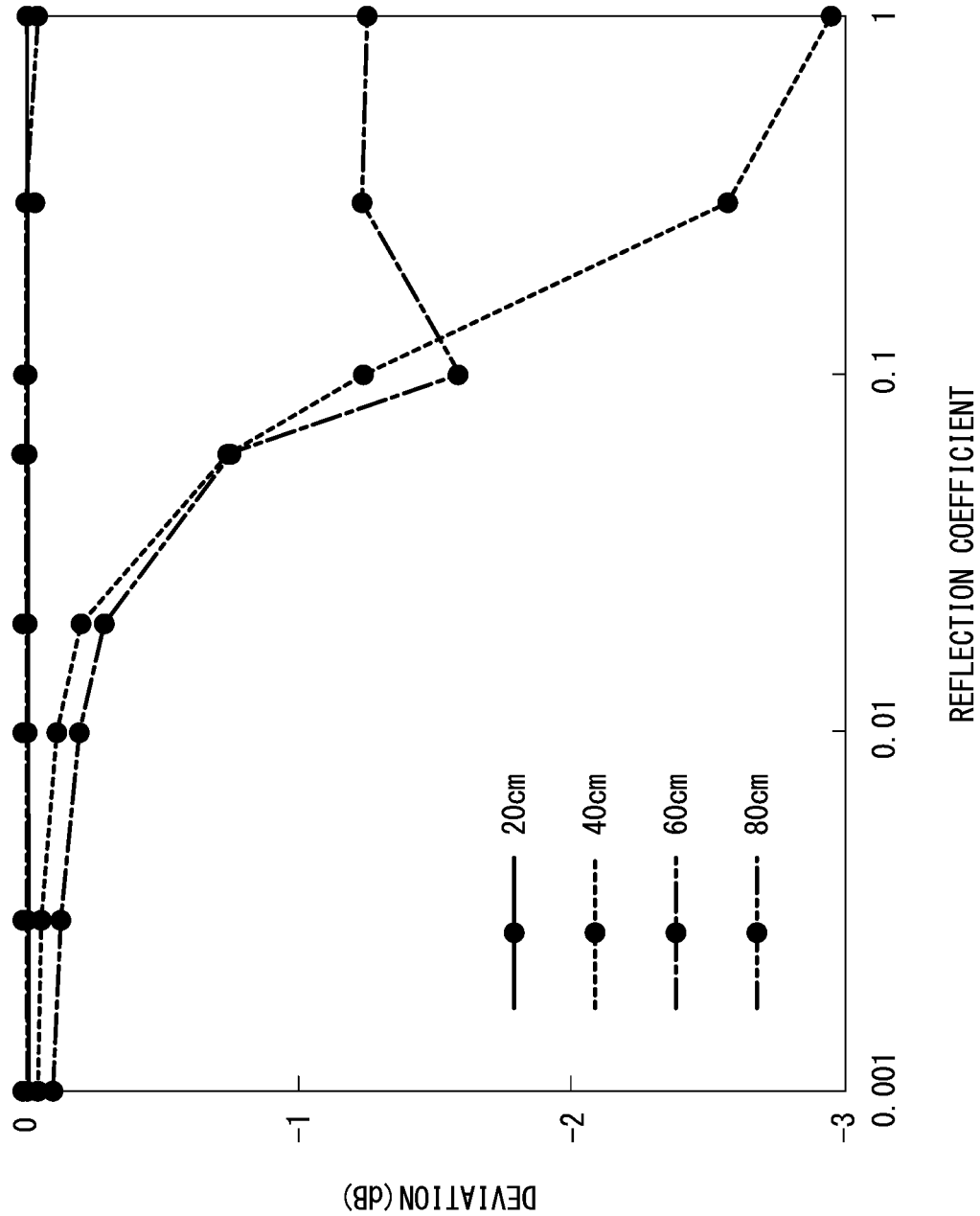
FIG. 6 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 6 GHz, and the radiation interference wave is a horizontally-polarized wave.
Figure 7:
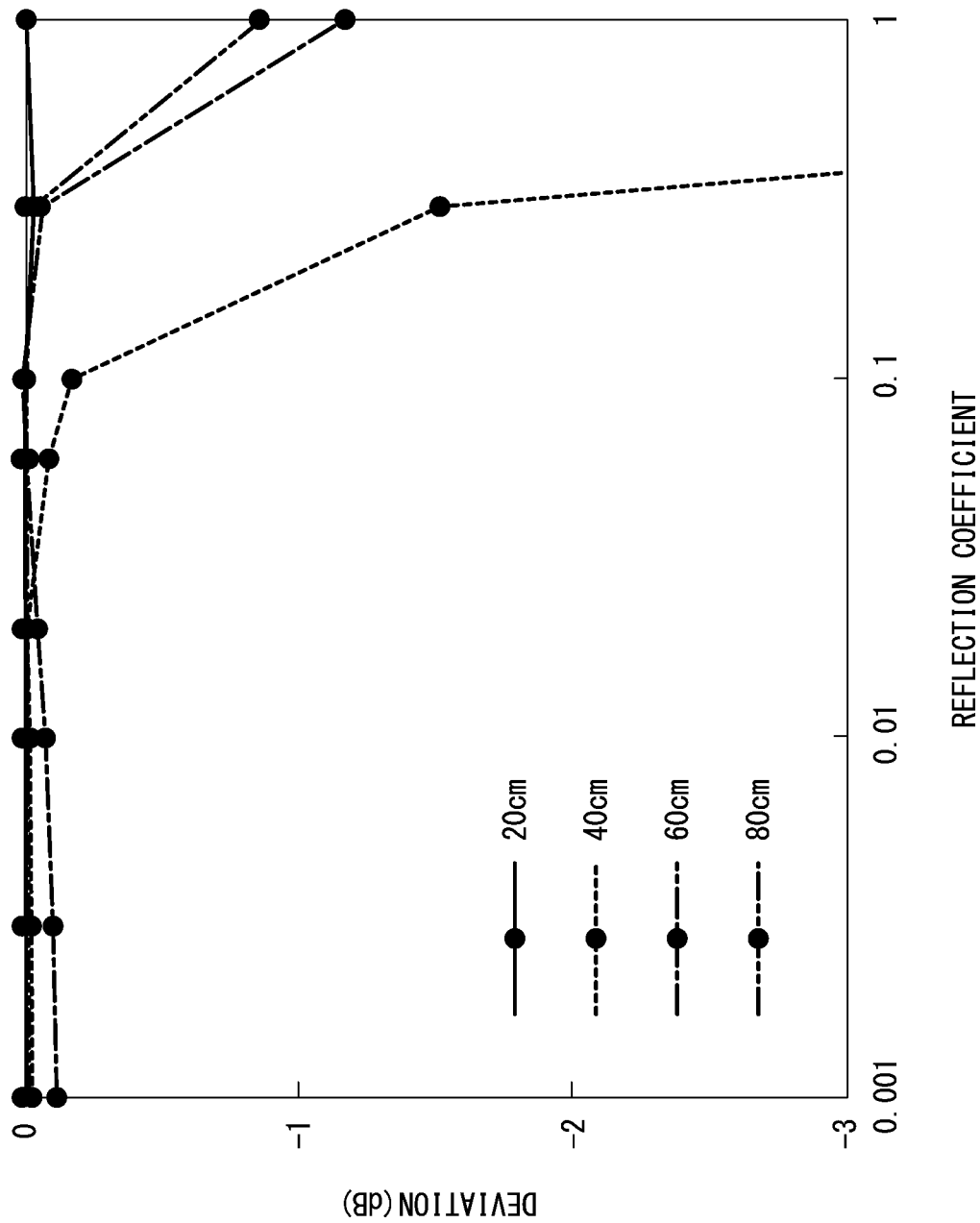
FIG. 7 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 6 GHz, and the radiation interference wave is a vertically-polarized wave.

FIG. 4 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 6 GHz, and the radiation interference wave is a horizontally-polarized wave. FIG. 5 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 6 GHz, and the radiation interference wave is a vertically-polarized wave. FIG. 6 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 6 GHz, and the radiation interference wave is a horizontally-polarized wave. FIG. 7 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 6 GHz, and the radiation interference wave is a vertically-polarized wave.

In all the FIGS. 4 to 7, the horizontal axis represents a reflection coefficient of the floor face, and the vertical axis represents a deviation between a maximum value of the first electric field distribution and a maximum value of the second electric field distribution. In addition, in all the FIGS. 4 to 7, four or five pieces of data having different shortest distances from the floor face to the test body 100 are illustrated. Furthermore, all the FIGS. 4 to 7 are diagrams of a case in which the frequency of a radiation interference wave of which an electric field intensity is measured and a sampling frequency are the same.

In the case of FIG. 4, when the reflection coefficient of the floor face becomes about 0.01 or less, the deviation converges up to 0.3 dB or less regardless of the shortest distance from the floor face to the test body 100. In the case of FIG. 5, when the reflection coefficient of the floor face becomes about 0.01 or less, the deviation converges up to 0.5 dB or less regardless of the shortest distance from the floor face to the test body 100. Also in the case of FIG. 6 and in the case of FIG. 7, when the reflection coefficient of the floor face becomes about 0.01 or less, the deviation converges up to 0.3 dB or less regardless of the shortest distance from the floor face to the test body 100. In other words, in a case in which the reflection coefficient of the floor face is 0.01 or less, it is judged that the reflection coefficient of the floor face does not need to be taken into account, and it can be regarded that there is no problem. Here, although a review has been carried out for a case in which the frequency of the radiation interference wave of which the electric field intensity is measured is 6 GHz, also for the other frequencies, a similar result is regarded under a condition of the sampling frequency and the measurement frequency being the same frequency.

Thus, the judgment function 201 calculates a deviation between a maximum value of an electric field in the first electric field distribution and a maximum value of an electric field in the second electric field distribution and judges that a radiation interference wave reflected on the floor face does not need to be taken into account in a case in which the deviation is equal to or smaller than a predetermined allowed value. On the other hand, the judgment function 201 calculates a deviation between a maximum value of an electric field in the first electric field distribution and a maximum value of an electric field in the second electric field distribution and judges that a radiation interference wave reflected on the floor face needs to be taken into account in a case in which the deviation exceeds a predetermined allowed value.

Next, a case in which the frequency of a radiation interference wave of which an electric field intensity is measured and a sampling frequency are different from each other will be described.

Figure 8:
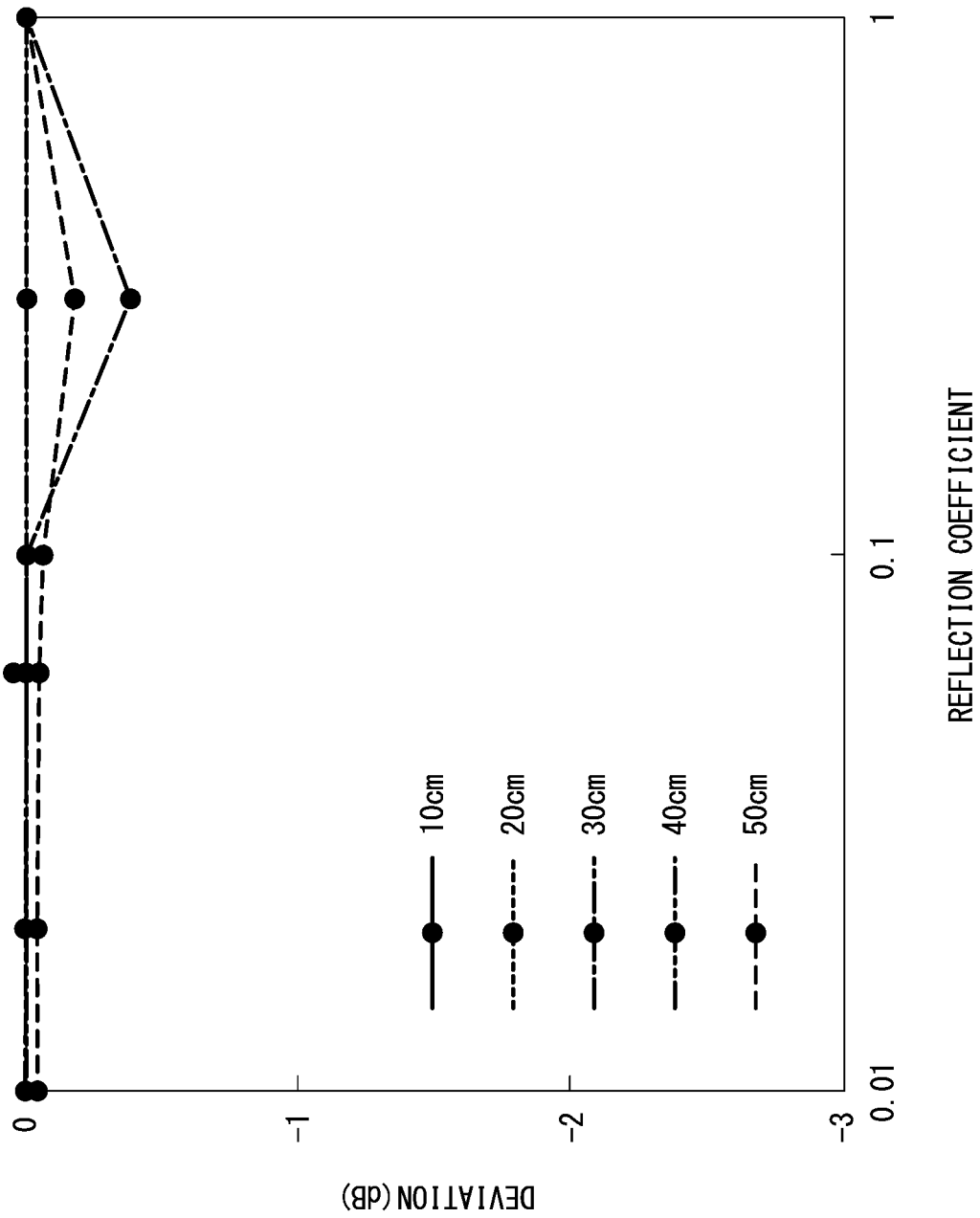
FIG. 8 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 1 GHz, and the radiation interference wave is a horizontally-polarized wave.
Figure 9:
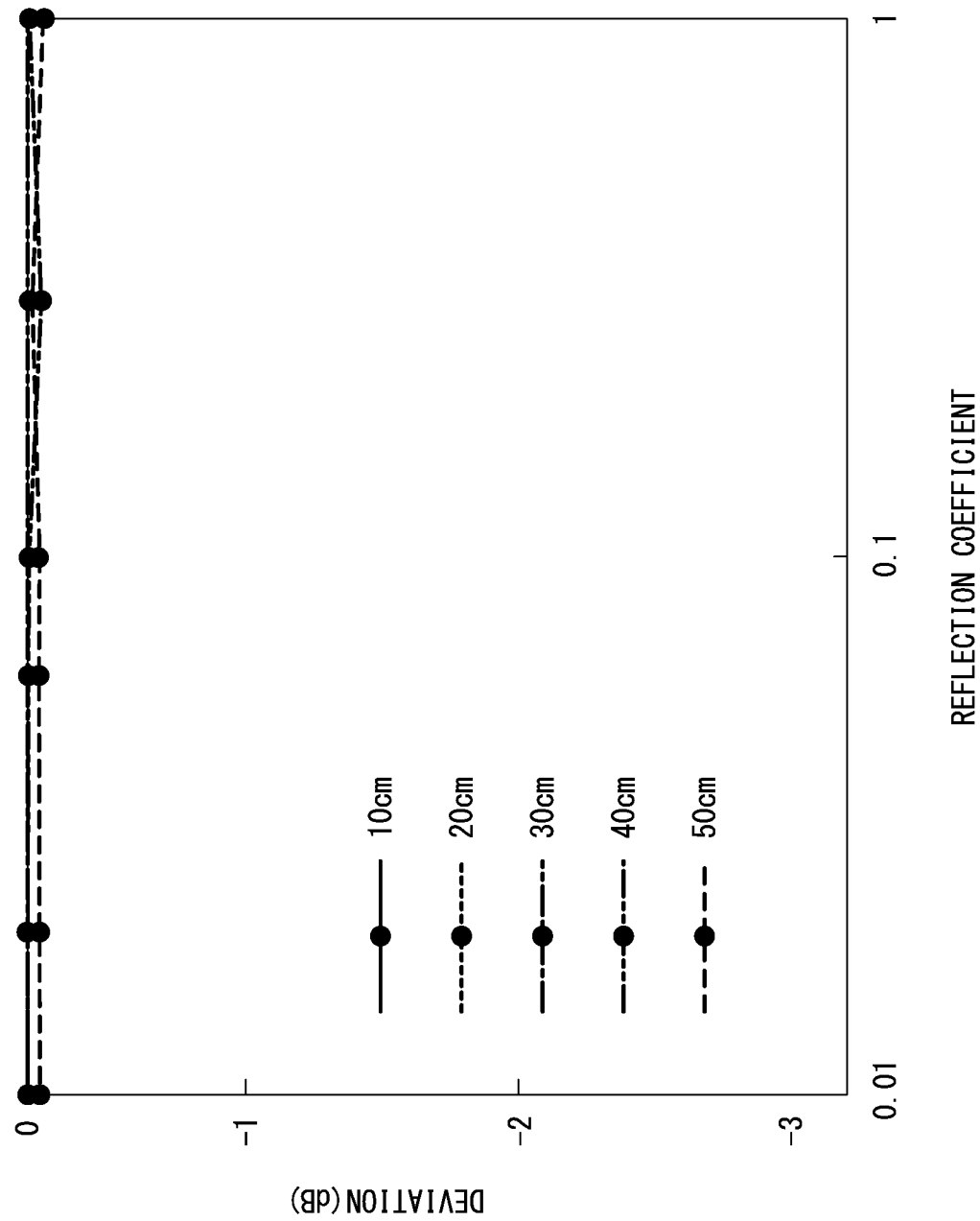
FIG. 9 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 1 GHz, and the radiation interference wave is a vertically-polarized wave.
Figure 10:
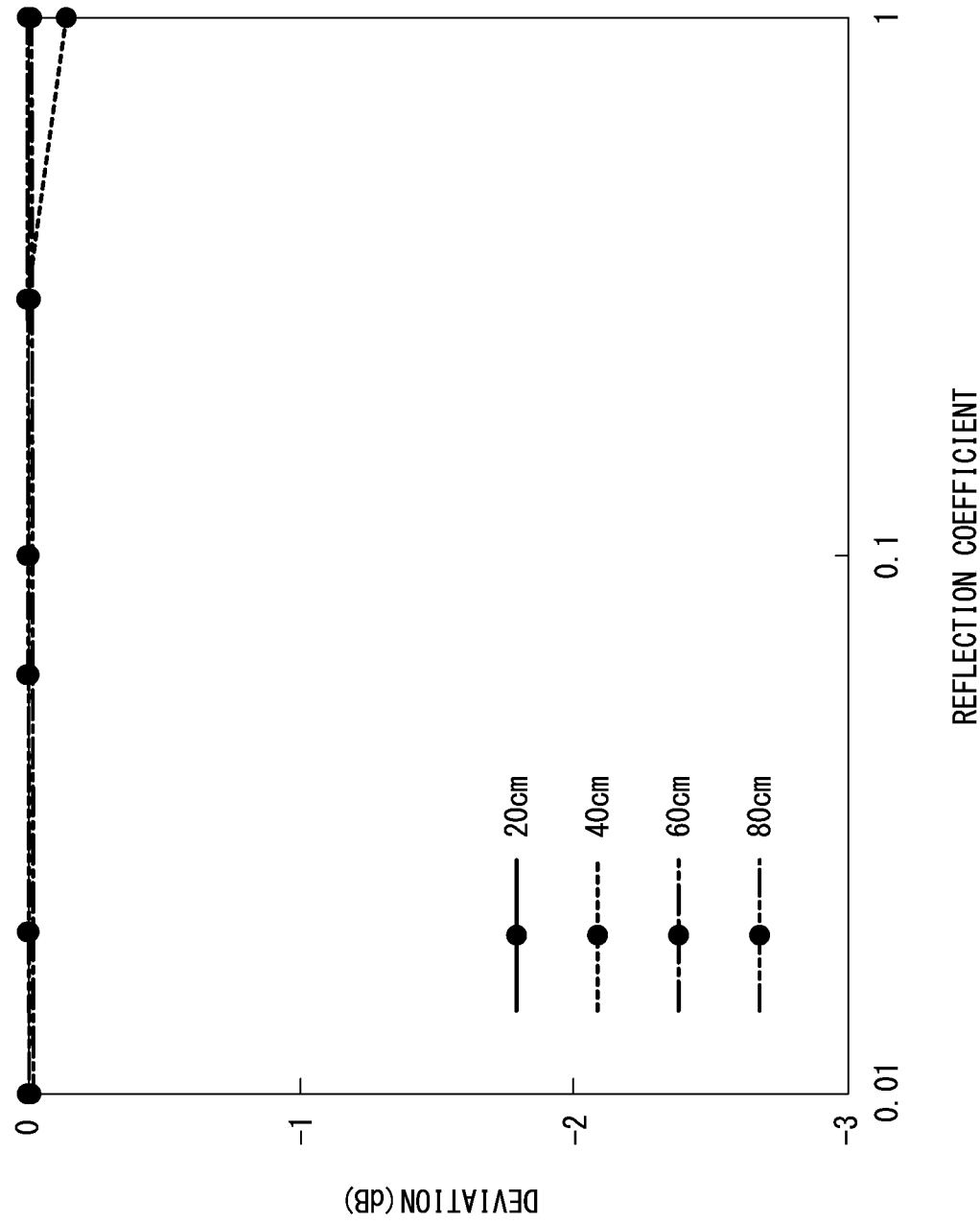
FIG. 10 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 1 GHz, and the radiation interference wave is a horizontally-polarized wave.
Figure 11:
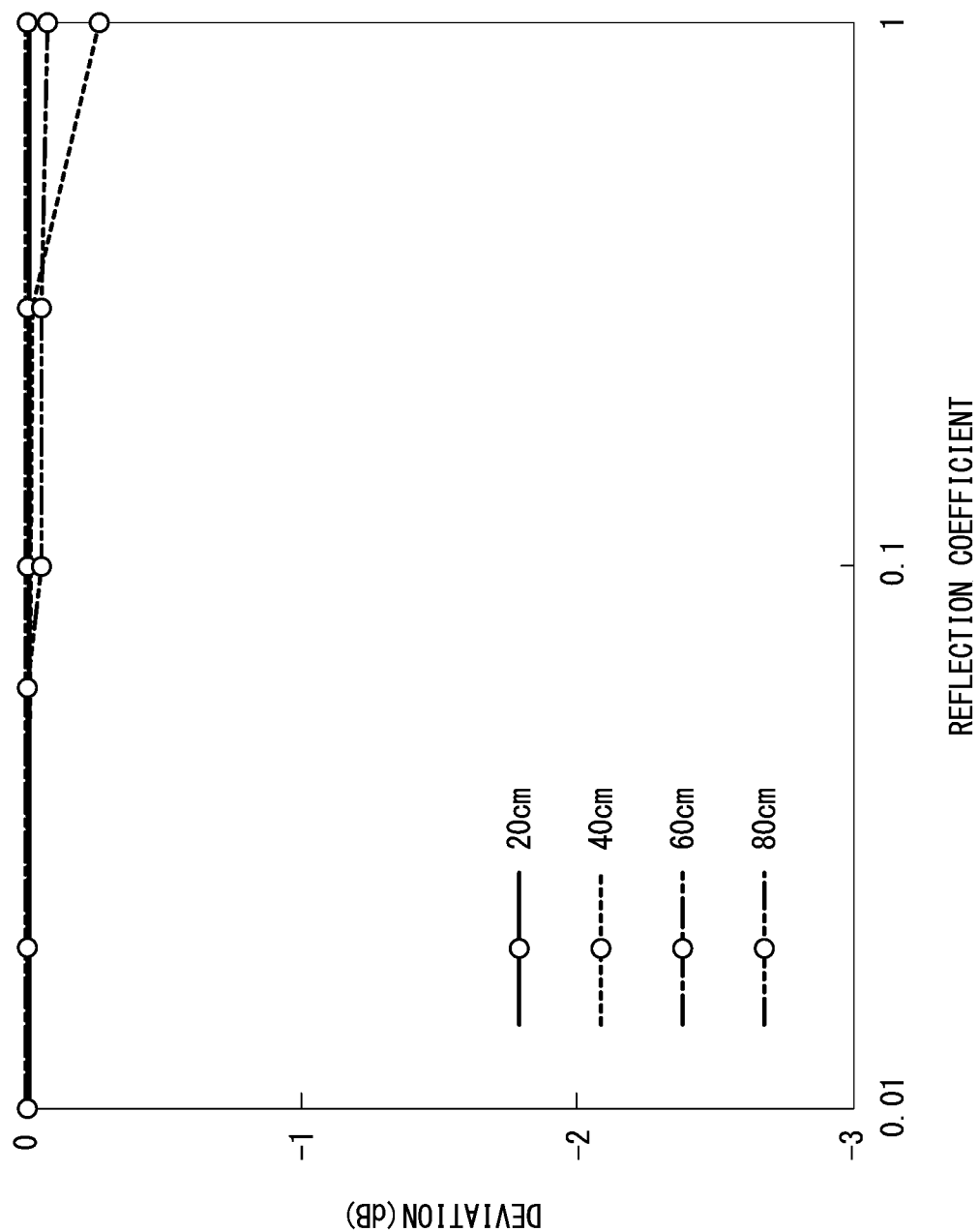
FIG. 11 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 1 GHz, and the radiation interference wave is a vertically-polarized wave.

FIG. 8 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 1 GHz, and the radiation interference wave is a horizontally-polarized wave. FIG. 9 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 1 GHz, and the radiation interference wave is a vertically-polarized wave. FIG. 10 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 1 GHz, and the radiation interference wave is a horizontally-polarized wave. FIG. 11 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 1 GHz, and the radiation interference wave is a vertically-polarized wave.

Also in the case of any one of FIGS. 8 to 11, when the reflection coefficient of the floor face becomes about 0.1 or less, the deviation converges up to 0.1 dB or less regardless of the shortest distance from the floor face to the test body 100.

Thus, the judgment function 201 calculates a deviation between a maximum value of an electric field in the first electric field distribution and a maximum value of an electric field in the second electromagnetic field distribution and judges that a radiation interference wave reflected on the floor face does not need to be taken into account in a case in which the deviation corresponds to a reflection coefficient that is equal to or smaller than a predetermined threshold. On the other hand, the judgment function 201 calculates a deviation between a maximum value of an electric field in the first electric field distribution and a maximum value of an electric field in the second electric field distribution and judges that a radiation interference wave reflected on the floor face needs to be taken into account in a case in which the deviation corresponds to a reflection coefficient exceeding a predetermined threshold. For example, the judgment function 201 executes judgment of whether a reflection coefficient input by a user using a mouse, a keyboard, or the like using the graph of FIG. 4 or the like acquired through a simulation is equal to or smaller than the predetermined threshold.

Figure 12:
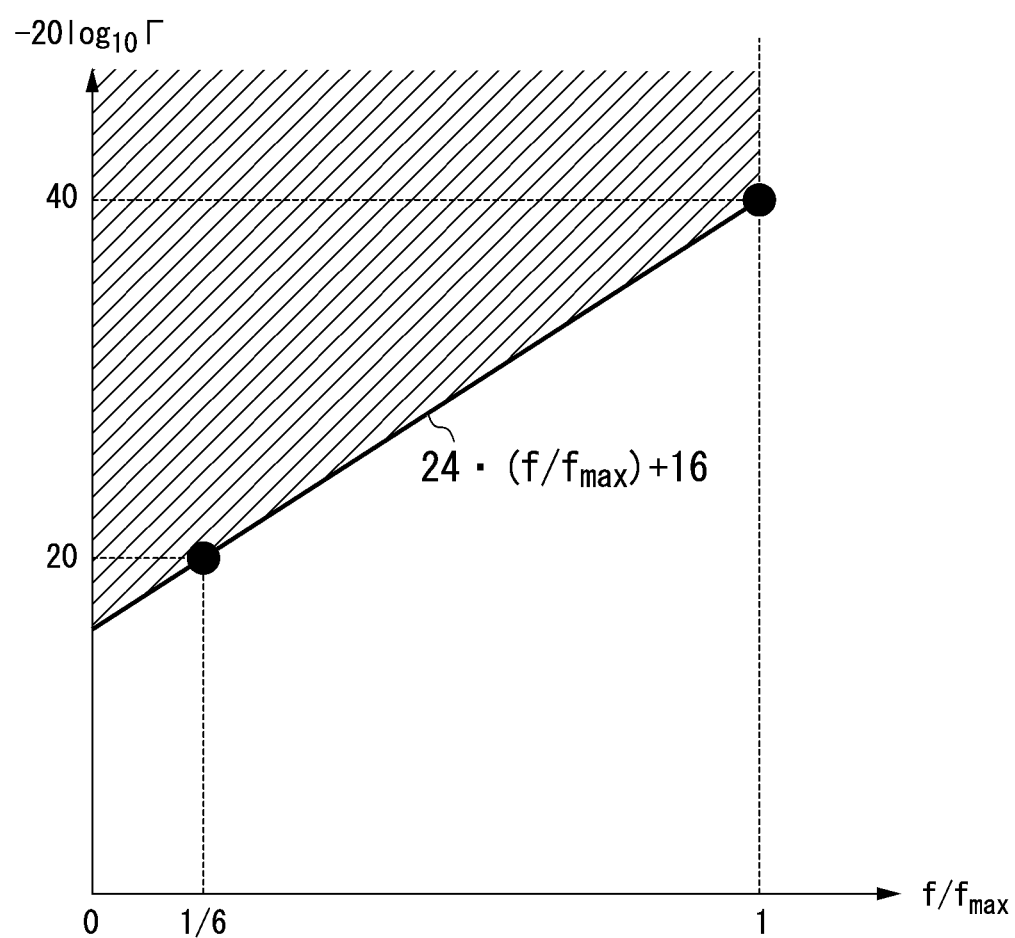
FIG. 12 is a diagram illustrating an example of a relation between a reflection coefficient of a floor face according to an embodiment and a quantity acquired by normalizing a frequency of a radiation interference wave, of which an electric field intensity is measured, with a sampling frequency.

Next, a reflection coefficient F of the floor face required for the deviation to converge for a quantity acquired by normalizing the frequency f of a radiation interference wave of which an electric field intensity is measured using a sampling frequency $f_{max}$ will be described. FIG. 12 is a diagram illustrating an example of a relation between a reflection coefficient of a floor face according to an embodiment and a quantity acquired by normalizing a frequency of a radiation interference wave, of which an electric field intensity is measured, with a sampling frequency. In FIG. 12, the horizontal axis represents a quantity acquired by normalizing the frequency f of the radiation interference wave of which an electric field intensity is measured using the sampling frequency $f_{max}$, and the vertical axis represents $-20*\log_{10} \Gamma$. In a case in which a condition corresponding to a hatched area illustrated in FIG. 12 is satisfied, in other words, in a case in which a condition satisfying the following Equation (25) is satisfied, the deviation described above can be regarded as converging at a sufficiently small value.

[Math. 25]

$$-20 \log_{10}\Gamma \geq 24 \cdot f/f_{max}+16 (0<f/f_{max} \leq 1) \qquad (25)$$

Figure 13:
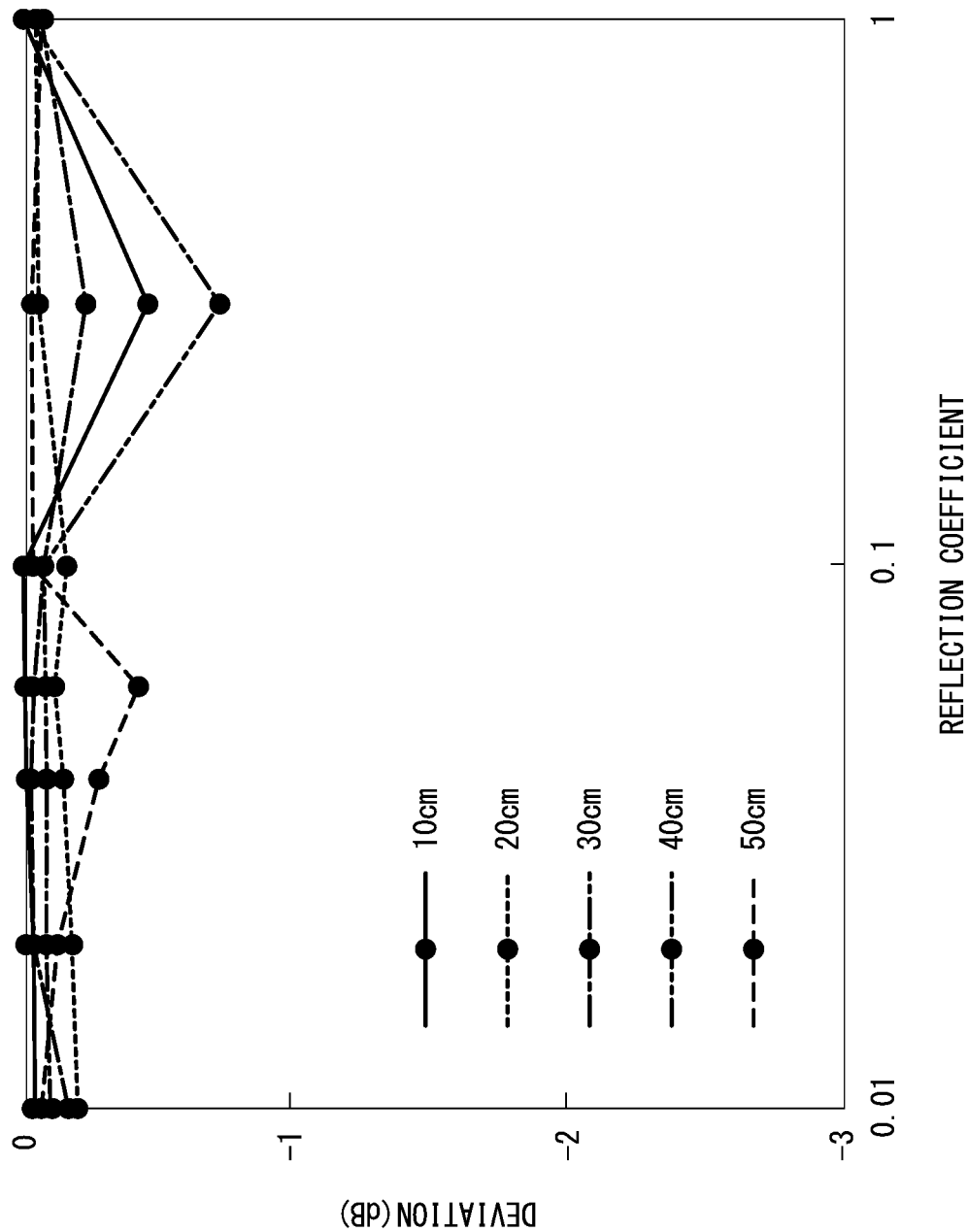
FIG. 13 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 3.5 GHz, and the radiation interference wave is a horizontally-polarized wave.
Figure 14:
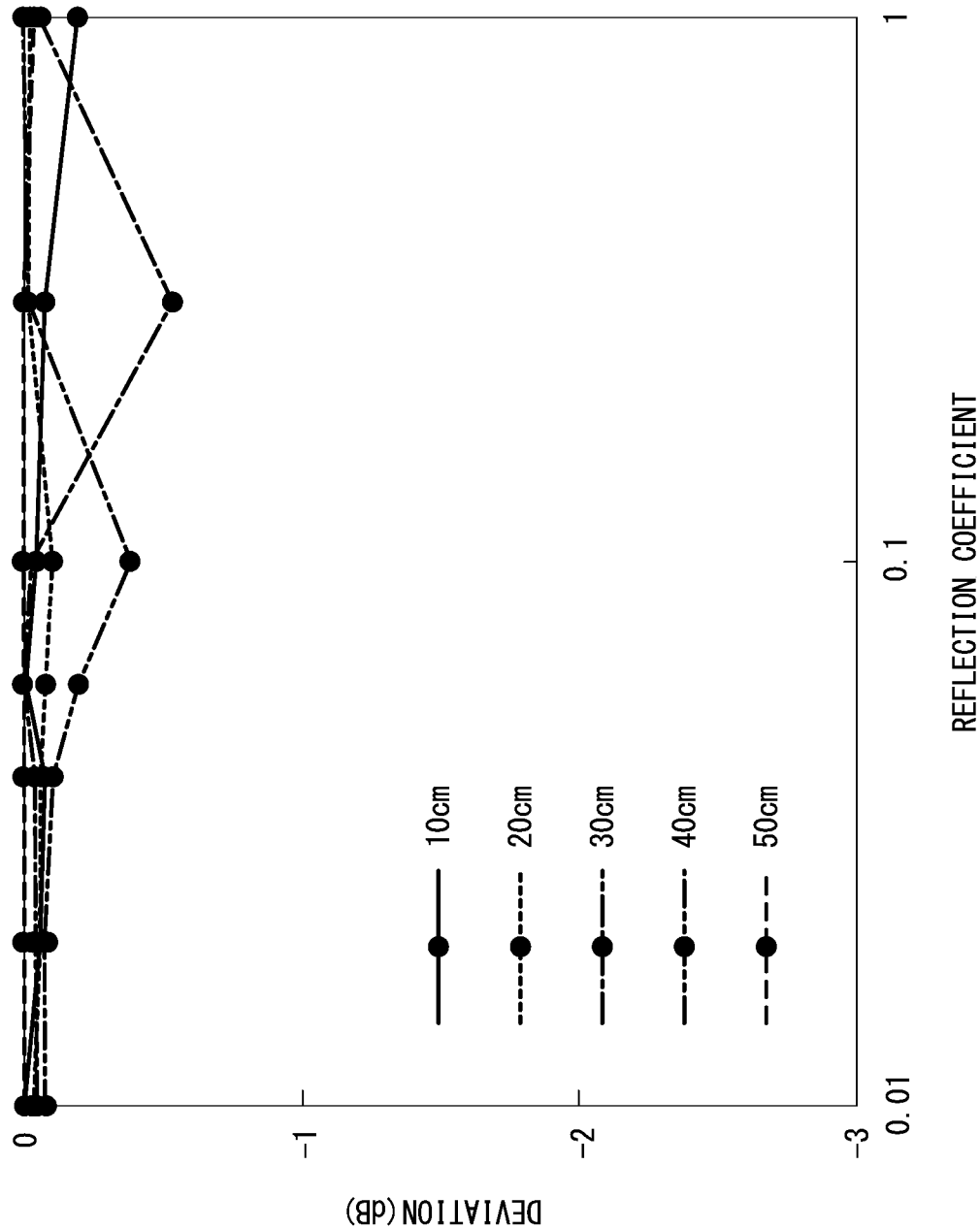
FIG. 14 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 3.5 GHz, and the radiation interference wave is a vertically-polarized wave.
Figure 15:
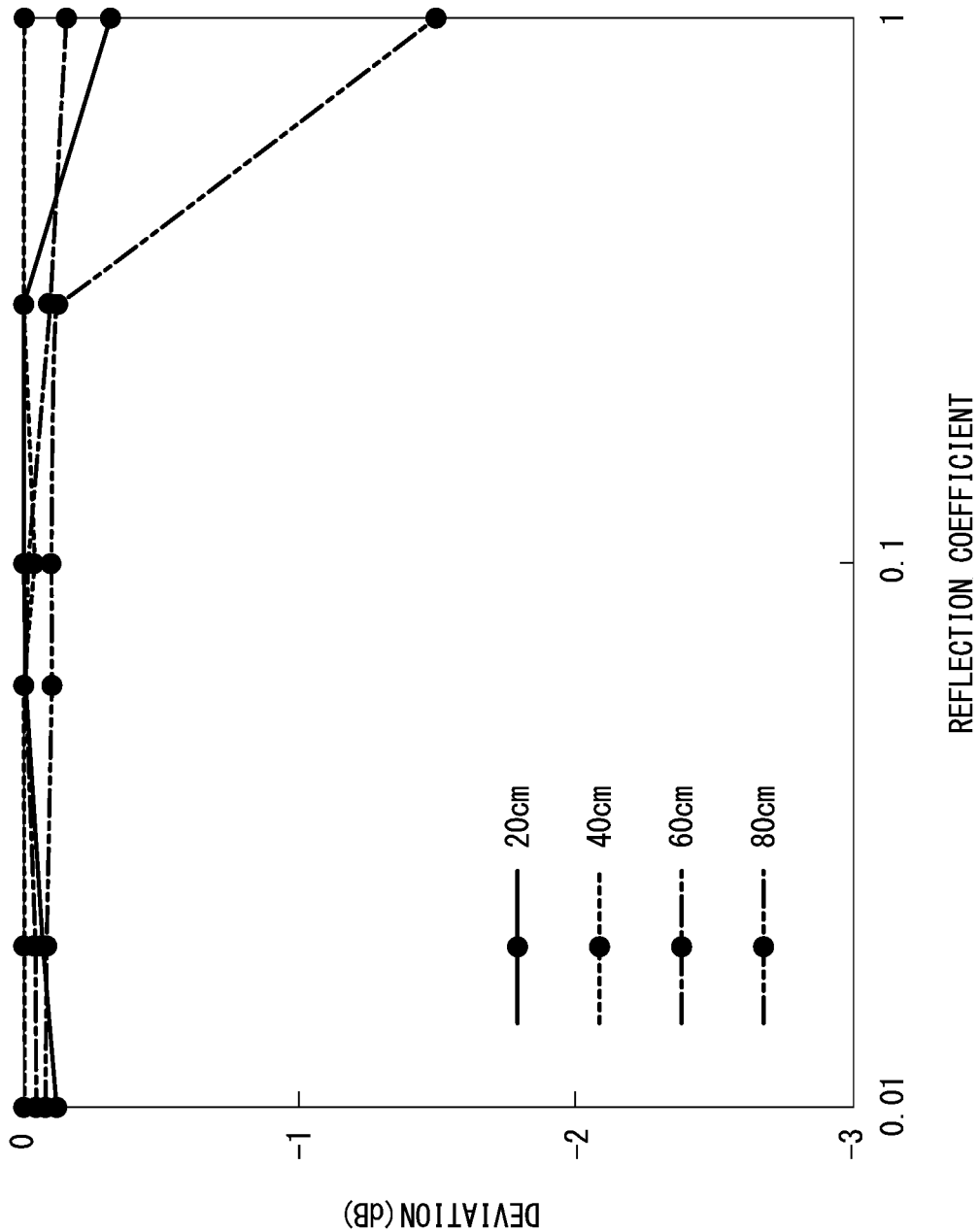
FIG. 15 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 3.5 GHz, and the radiation interference wave is a horizontally-polarized wave.
Figure 16:
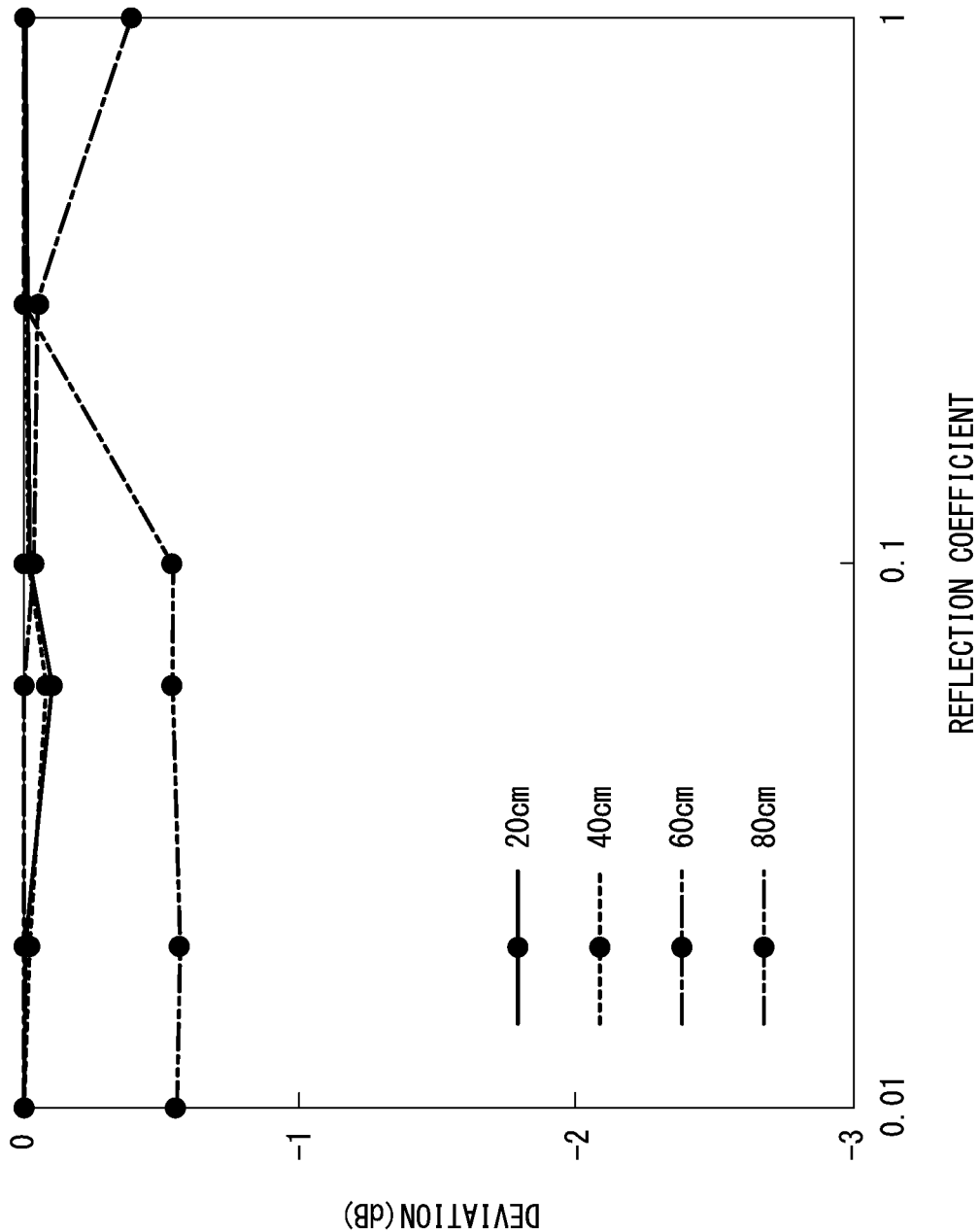
FIG. 16 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 3.5 GHz, and the radiation interference wave is a vertically-polarized wave.

In addition, the reliability of Equation (25) described above will be reviewed with reference to FIGS. 13 to 16. FIG. 13 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 3.5 GHz, and the radiation interference wave is a horizontally-polarized wave. FIG. 14 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 100 cm, a frequency of a radiation interference wave of which an electric field intensity is measured is 3.5 GHz, and the radiation interference wave is a vertically-polarized wave. FIG. 15 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 3.5 GHz, and the radiation interference wave is a horizontally-polarized wave. FIG. 16 is a diagram illustrating an example of a relation between a reflection coefficient of a floor face and a deviation between a maximum value of a first electric field distribution and a maximum value of a second electric field distribution in a case in which a size of a test body according to an embodiment in a height direction is 20 cm, a frequency of a radiation interference wave of which an electric field intensity is measured is 3.5 GHz, and the radiation interference wave is a vertically-polarized wave.

In a case in which the frequency of the radiation interference wave of which the electric field intensity is measured is 3.5 GHz, the reflection coefficient of the floor face calculated using Equation (25) described above is equal to or smaller than 0.0316. In the case of FIG. 13 and in the case of FIG. 14, when the reflection coefficient of the floor face becomes equal to or smaller than about 0.06, the deviation converges up to 0.2 dB or less regardless of a shortest distance from the floor face to the test body 100. In the case of FIG. 15 and in the case of FIG. 16, when the reflection coefficient of the floor face becomes about 0.06 or less, the deviation converges up to 0.6 dB or less regardless of a shortest distance from the floor face to the test body 100. Thus, Equation (25) described above can be regarded as being sufficiently reliable.

Here, in a case in which the reflection coefficient of the floor face, the frequency of the radiation interference wave, and the sampling frequency calculated from a maximum frequency of the radiation interference wave satisfy Equation (25) described above, the judgment function 201 judges that the radiation interference wave reflected on the floor face does not need to be taken into account. On the other hand, in a case in which the reflection coefficient of the floor face, the frequency of the radiation interference wave, and the sampling frequency calculated from the maximum frequency of the radiation interference wave do not satisfy Equation (25) described above, the judgment function 201 judges that the radiation interference wave reflected on the floor face needs to be taken into account.

From the description presented until now, it has been disclosed that it may be regarded that a radiation interference wave reflected on the floor face does not need to be taken into account in a case in which the reflection coefficient of the floor face is sufficiently small. In addition, as described above, in a case in which the frequency of the radiation interference wave reflected on the floor face and the sampling frequency are the same, it is preferable that the reflection coefficient of the floor face be equal to or smaller than 0.01. Furthermore, the following Equation (26) acquired by converting Equation (25) described above into an absorption characteristic of the floor face for the radiation interference wave may be used.

[Math. 26]

$$\text{Absorption characteristic (dB)} \geq -20 \log_{10} \Gamma \quad (26)$$

By using Equations (25) and (26) described above, in a case in which the frequency of the radiation interference wave reflected on the floor face and the sampling frequency are the same, it can be understood that the absorption characteristic of the floor face for the radiation interference wave needs to be 40 dB or more. In addition, in a case in which the frequency of the radiation interference wave reflected on the floor face is lower than the sampling frequency, it can be understood that the absorption characteristic of the floor face for the radiation interference wave needs to be a value calculated by substituting the frequency and the sampling frequency into Equation (25) described above or more. An example of an electric wave absorber satisfying such a condition includes the electric wave absorber 14 described above. By spreading these all over the floor face, Equation (26) described above is satisfied.

Thus, in a case in which the absorption characteristic of the floor face for the frequency of the radiation interference wave of which an electric field is measured satisfies Equation (26) described above, the judgment function 201 judges that the radiation interference wave reflected on the floor face does not need to be taken into account. On the other hand, in a case in which the absorption characteristic of the floor face for the frequency of the radiation interference wave of which an electric field is measured does not satisfy Equation (26) described above, the judgment function judges that the radiation interference wave reflected on the floor face needs to be taken into account.

In addition, in a case in which an electric wave absorber of which a height with reference to the floor face is equal to or larger than larger one of $0.45\lambda_{min}$ and $2.8\lambda_{max}$ is provided on the floor face, it is regarded that at least one of the conditions described above is satisfied. Here, $\lambda_{min}$ is a wavelength corresponding to a minimum value of the frequency of a radiation interference wave of which an electric field intensity is measured. In addition, $\lambda_{max}$ is a wavelength corresponding to the sampling frequency that is a maximum value of the frequency of a radiation interference wave of which an electric field intensity is measured. Thus, in a case in which an electric wave absorber of which a height with reference to the floor face is equal to or larger than a value of larger one of $0.45\lambda_{min}$ and $2.8\lambda_{max}$ is provided on the floor face, the judgment function 201 judges that the radiation interference wave reflected on the floor face does not need to be taken into account. On the other hand, in a case in which an electric wave absorber of which a height with reference to the floor face is smaller than a value of larger one of $0.45\lambda_{min}$ and $2.8\lambda_{max}$ is provided on the floor face or no electric wave absorber is laid, the judgment function 201 judges that the radiation interference wave reflected on the floor face needs to be taken into account.

Figure 17:
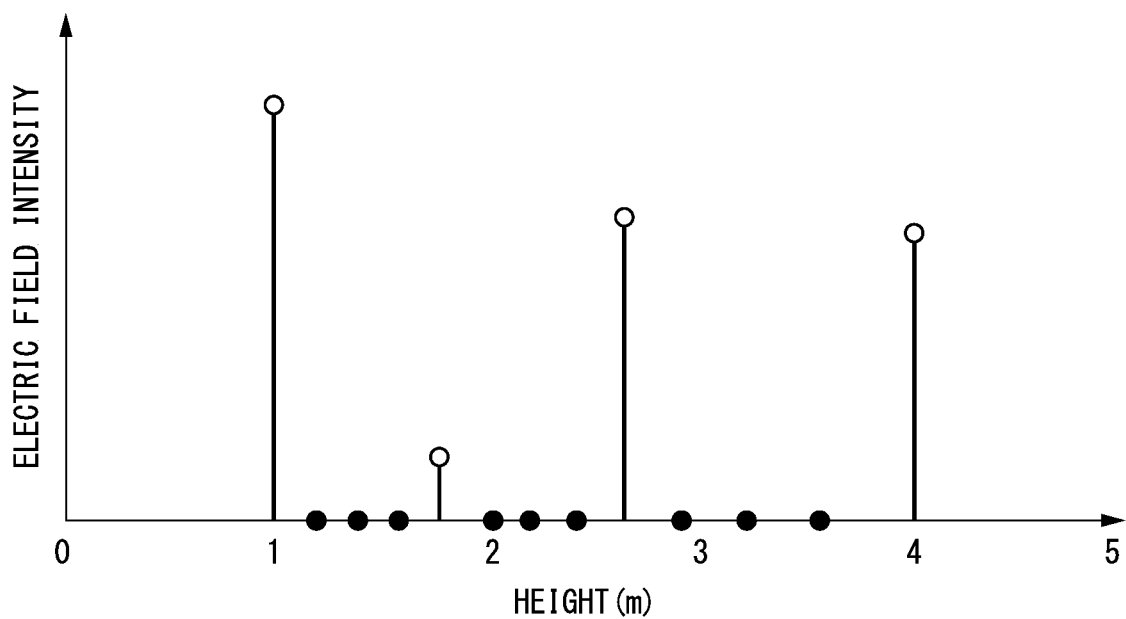
FIG. 17 is a diagram illustrating an example of a part of an electric field intensity distribution before interpolation according to an embodiment.

FIG. 17 is a diagram illustrating an example of a part of an electric field intensity distribution before interpolation according to an embodiment. The radiation interference wave measurement device 1 measures electric field intensities of a radiation interference wave for heights of the antenna 11 sequentially calculated based on a correction coefficient $K_{hmax}$ calculated using Equation (20) or (23) described above and, for example, acquires electric field intensities before interpolation illustrated in FIG. 17. In FIG. 17, white circles represent electric field intensities measured with an interval thereof. In FIG. 17, black circles represent interpolated zeros.

Figure 18:
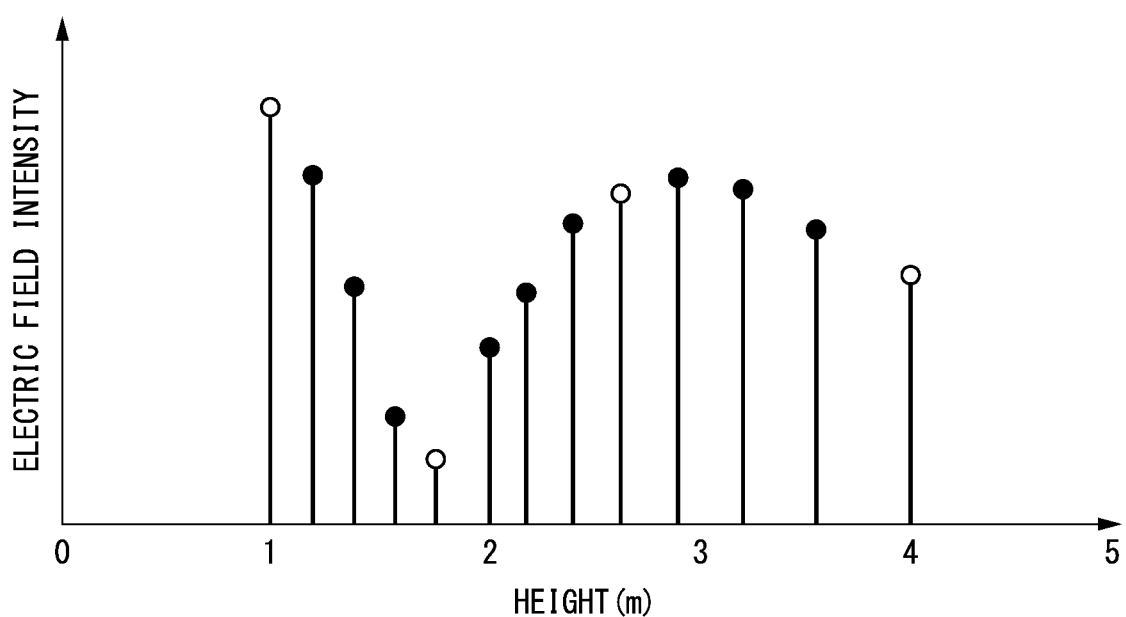
FIG. 18 is a diagram illustrating an example of a part of an electric field intensity distribution after interpolation according to an embodiment.

FIG. 18 is a diagram illustrating an example of a part of an electric field intensity distribution after interpolation according to an embodiment. By applying a lowpass filter having a cutoff frequency that is the same as the frequency of a radiation interference wave for which an electric field is measured to the electric field intensities before interpolation illustrated in FIG. 17, the radiation interference wave measurement device 1 generates electric field intensities after interpolation illustrated in FIG. 18. White circles illustrated in FIG. 18 exhibit the same electric field intensities as those of the white circles illustrated in FIG. 17. Black circles illustrated in FIG. 18 represent electric field intensities reproduced by performing interpolation by applying the lowpass filter.

For example, the reception unit 30 is a spectrum analyzer of a superheterodyne reception device system or a spectrum analyzer of an FFT system. The reception unit 30 performs a measurement process of measuring electric field intensities of a predetermined frequency band at measurement points positioned on a face surrounding a test body 100. Then, the reception unit 30 measures an electric field intensity for a predetermined time for a measurement point at which a maximum electric field intensity has been measured.

Figure 19:
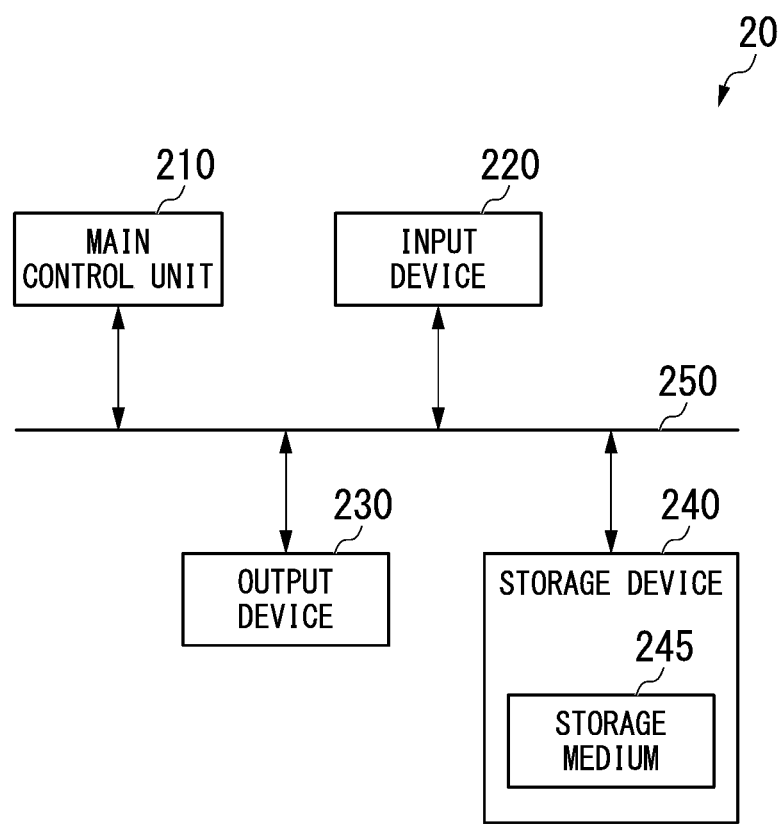
FIG. 19 is a diagram illustrating an example of the hardware configuration of a control unit according to an embodiment.

FIG. 19 is a diagram illustrating an example of the hardware configuration of the control unit according to an embodiment. As illustrated in FIG. 19, the control unit 20 includes a main control unit 210, an input device 220, an output device 230, a storage device 240, and a bus 250.

The main control unit 210 includes a CPU (Central Processing Unit) and a RAM (Random Access Memory), controls transmission/reception of data between the input device 220, the output device 230, and the storage device 240, and controls operations of the output device 230 and the storage device 240.

The input device 220 is a device that is used for inputting data required for the operation of the radiation interference wave measurement device 1 and is, for example, a keyboard, a mouse, or a touch panel.

The output device 230 is a device that is used for outputting information relating to the operation of the radiation interference wave measurement device 1 and is, for example, a display.

The storage device 240 is a device that is used for storing data and is, for example, a hard disk device or an optical disc device. In addition, the storage device 240 includes a storage medium 245, stores data in the storage medium 245, and reads data from the storage medium 245. The storage medium 245 is a storage medium that is used for storing data and, for example, is a hard disk or an optical disc. In addition, the storage medium 245 stores a program that realizes the judgment function 201, the correction coefficient calculating function 202, the measurement height calculating function 203, the first electromagnetic field distribution acquiring function 204, and the second electromagnetic field distribution acquiring function 205. In this case, by reading and executing such a program, the main control unit 210 realizes the functions of the judgment function 201, the correction coefficient calculating function 202, and the measurement height calculating function 203.

The bus 250 connects the main control unit 210, the input device 220, the output device 230, and the storage device 240 to be able to communicate with each other.

Figure 20:
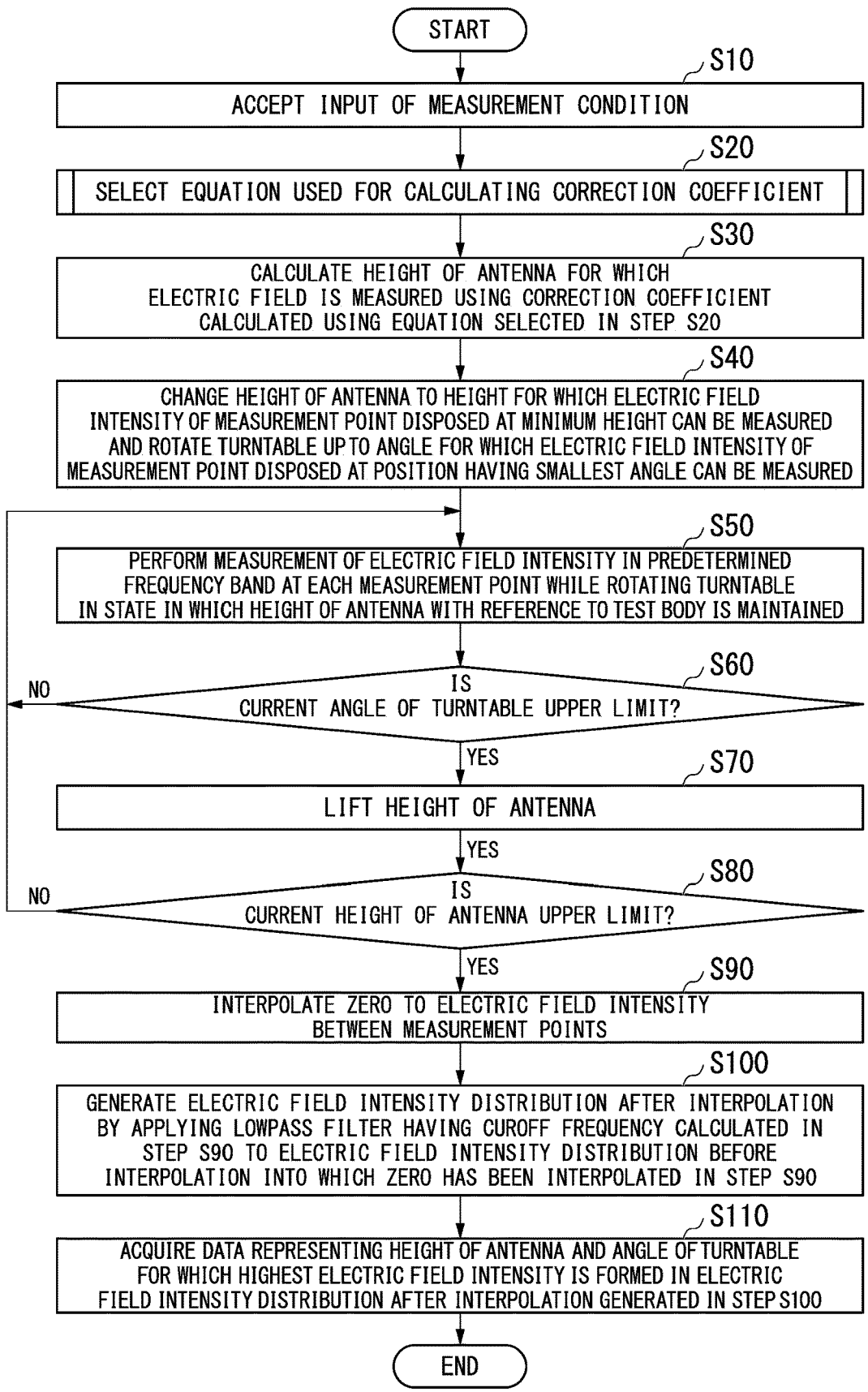
FIG. 20 is a flowchart illustrating an example of a process performed by a radiation interference wave measurement device according to an embodiment.

Next, an example of the operations of the radiation interference wave measurement device according to an embodiment will be described with reference to FIG. 20. FIG. 20 is a flowchart illustrating an example of a process performed by the radiation interference wave measurement device according to an embodiment.

In Step S10, the radiation interference wave measurement device 1 accepts an input of measurement conditions. For example, the measurement conditions described here include a frequency band of a radiation interference wave of which an electric field intensity is measured, a measurement range with reference to the ground plane in the height direction, an interval of measurement points in the height direction, a measurement range in an angle direction, an interval of measurement points in the angle direction, a sampling time, and a detection method and a frequency resolution bandwidth of the reception unit 30.

In Step S20, the correction coefficient calculating function 202 selects an equation that is used for calculating a correction coefficient. Details of Step S20 will be described below.

In Step S30, the measurement height calculating function 203 calculates a height of the antenna for which an electric field is measured using the correction coefficient calculated using the equation selected in Step S20.

In Step S40, the controller 15 changes the height of the antenna 11 to a height for which an electric field intensity of a measurement point disposed at a lowest height can be measured and rotates the turntable 13 up to an angle for which the electric field intensity of the measurement point disposed at a position having the smallest angle can be measured.

In Step S50, the radiation interference wave measurement device 1 measures an electric field intensity in a predetermined frequency band for each measurement point while rotating the turntable 13 in a state in which the height of the antenna 11 with reference to the test body 100 is maintained.

In Step S60, the radiation interference wave measurement device 1 judges whether or not the current angle of the turntable is an upper limit. In a case in which it is judged that the current angle of the turntable is the upper limit (Step S60: Yes), the radiation interference wave measurement device 1 causes the process to proceed to Step S70. In a case in which it is judged that the current angle of the turntable is not the upper limit (Step S60: No), the radiation interference wave measurement device 1 causes the process to return to Step S50.

In Step S70, the controller 15 lifts the height of the antenna 11.

In Step S80, the radiation interference wave measurement device 1 judges whether or not the current height of the antenna is an upper limit. In a case in which it is judged that the current height of the antenna is the upper limit (Step S80: Yes), the radiation interference wave measurement device 1 causes the process to proceed to Step S90. In a case in which it is judged that the current height of the antenna is not the upper limit (Step S80: No), the radiation interference wave measurement device 1 causes the process to return to Step S50.

In Step S90, the radiation interference wave measurement device 1 interpolates zeros to electric field intensities between the measurement points.

In Step S100, the radiation interference wave measurement device 1 generates an electric field intensity distribution after interpolation by applying a lowpass filter having the cutoff frequency calculated in Step S90 to the electric field intensity distribution before interpolation in which zeros have been interpolated in Step S90.

In Step S110, the radiation interference wave measurement device 1 acquires data that represents a height of the antenna and an angle of the turntable for which a maximum electric field intensity is formed in the electric field intensity distribution after interpolation generated in Step S100.

Figure 21:
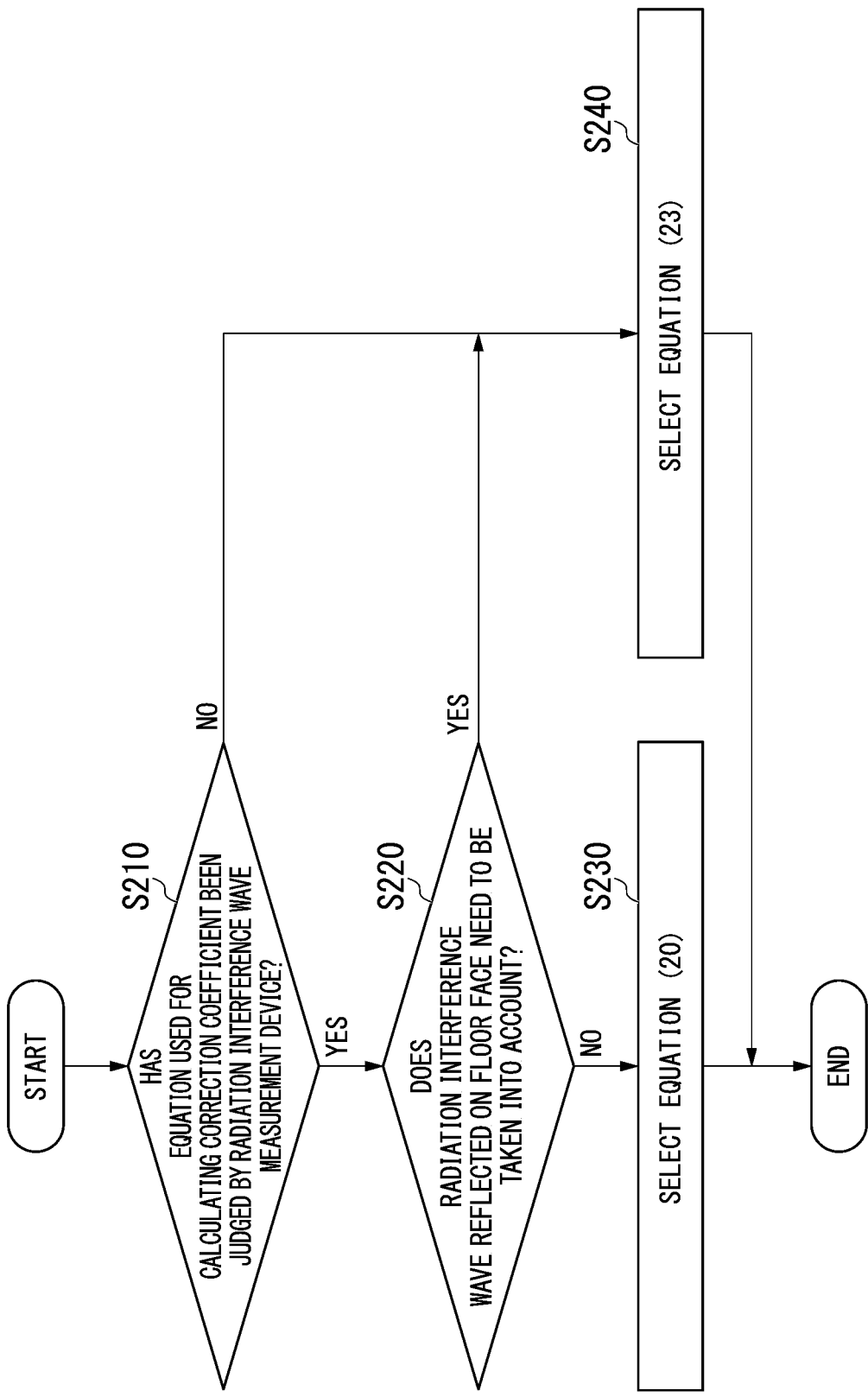
FIG. 21 is a flowchart illustrating an example of a process of a radiation interference wave measurement device according to an embodiment selecting an equation for calculating a correction coefficient.

Next, details of Step S20 illustrated in FIG. 20, in other words, an example of the process of the radiation interference wave measurement device 1 according to an embodiment calculating a correction coefficient will be described with reference to FIG. 21. FIG. 21 is a flowchart illustrating an example of a process of a radiation interference wave measurement device according to an embodiment selecting an equation for calculating a correction coefficient.

In Step S210, the correction coefficient calculating function 202 judges whether or not an equation used for calculating a correction coefficient is judged by the radiation interference wave measurement device 1. In a case in which it is judged that an equation used for calculating a correction coefficient is judged by the radiation interference wave measurement device 1 (Step S210: Yes), the correction coefficient calculating function 202 causes the process to proceed to Step S220. In a case in which it is judged that an equation used for calculating a correction coefficient is not judged by the radiation interference wave measurement device 1 (Step S210: No), the correction coefficient calculating function 202 causes the process to proceed to Step S240.

In Step S220, the correction coefficient calculating function 202 judges whether or not a radiation interference wave reflected on the floor face needs to be taken into account. In a case in which it is judged that a radiation interference wave reflected on the floor face needs to be taken into account (Step S220: Yes), the correction coefficient calculating function 202 causes the process to proceed to Step S240. In a case in which it is judged that a radiation interference wave reflected on the floor face does not needs to be taken into account (Step S220:No), the correction coefficient calculating function 202 causes the process to proceed to Step S230. More specifically, the correction coefficient calculating function 202 performs a corresponding judgement based on one of the judgments described above.

In Step S230, the correction coefficient calculating function 202 selects Equation (20) described above.

In Step S240, the correction coefficient calculating function 202 selects Equation (23) described above.

As above, the radiation interference wave measurement device 1 according to an embodiment has been described. The radiation interference wave measurement device 1 includes the correction coefficient calculating function 202 that calculates a correction coefficient for which an interval of heights of the antenna 11 satisfies a sampling theorem based on a relative positional relation between the test body 100 including a radiation source radiating a radiation interference wave and the antenna 11 performing measurement of an electric field of the radiation interference wave and the measurement height calculating function 203 that sequentially calculates heights of the antenna in a case in which measurement is performed using the correction coefficient. Thus, the radiation interference wave measurement device 1 narrows down the height of the antenna 11 for which an electric field needs to be measured and can shorten a time required for performing a radiation interference wave test.

In addition, the radiation interference wave measurement device 1 includes a computer that executes the judgment function 201 for judging whether or not a radiation interference wave reflected on the floor face needs to be taken into account. Thus, the radiation interference wave measurement device 1 can select an appropriate equation in accordance with whether or not an electric field needs to be measured with a radiation interference wave reflected on the floor face taken into account, calculate an accurate correction coefficient, and achieve the effects described above.

In addition, in the embodiment described above, although a case in which the radiation interference wave measurement device 1 measures electric field intensities at measurement points and generates an electric field intensity distribution after interpolation has been described as an example, the configuration is not limited thereto. For example, the radiation interference wave measurement device 1 may measure magnetic field intensities at measurement points and generate a magnetic field intensity distribution after interpolation by applying the lowpass filter described above to the magnetic field intensity distribution before interpolation. Alternatively, the radiation interference wave measurement device 1 may measure not electric field intensities but values corresponding to contents of absolute value symbols of right-side equations of the first symbol of Equation (2) described above, measure a distribution of the values, and perform interpolation by applying the lowpass filter described above to the distribution of the values.

In addition, in a case in which it is judged that a radiation interference wave reflected on the floor face needs to be taken into account, the correction coefficient calculating function 202 may stop calculation of the correction coefficient $K_{hmax}$ instead of calculating the correction coefficient $K_{hmax}$ using Equation (23) described above. In addition, in such a case, the correction coefficient calculating function 202 may perform control of the radiation interference wave measurement device 1 such that necessity for taking a radiation interference wave reflected on the floor face into account is notified.

Furthermore, the correction coefficient calculating function 202 may calculate a correction coefficient using Equation (23) regardless of whether or not a radiation interference wave reflected on the floor face needs to be taken into account.

In addition, the radiation interference wave described above may be radiated not from the test body 100 but from a radiation source set with a radiation interference wave considered.

In addition, a program used for realizing the functions of the controller 15, the control unit 20, and the reception unit 30 according to the embodiment described above may be recorded on a computer-readable recording medium, and a computer system may be caused to read and execute the program recorded on this recording medium for performing the process. In addition, particularly, this recording medium may store an electromagnetic field distribution generation program used for causing a computer to execute the judgment function 201, the correction coefficient calculating function 202, the measurement height calculating function 203, the first electromagnetic field distribution acquiring function 204, and the second electromagnetic field distribution acquiring function 205.

The computer system described here may include an operating system (OS) and hardware such as peripherals. The computer-readable recording medium, for example, includes a writable nonvolatile memory such as a floppy disk, a magneto-optical disk, a read only memory (ROM), or a flash memory, a portable medium such as a digital versatile disc (DVD), and a storage device such as a hard disk built into the computer system and includes a medium storing a program for a predetermined time such as an internal volatile memory of a computer system serving as a server or a client in a case in which the program is transmitted through a network or a communication line.

Furthermore, the program described above may be transmitted from a computer system storing the program in a storage device or the like to another computer system through a transmission medium or using transmission waves in a transmission medium. Here, the transmission medium transmitting the program represents a medium having a function of transmitting information such as a network including the Internet and the like or a communication line including a telephone line and the like.

In addition, the program described above may be used for realizing some of the functions described above and may be a program realizing the functions described above by being combined with a program recorded in the computer system in advance, a so-called a differential program. The program described above, for example, is read and executed by a processor such as a central processing unit (CPU) included in a computer.

While a preferred embodiment of the present invention has been described in detail with reference to the drawings, a specific configuration is not limited to such an embodiment, and various modifications and substitutions can be made within a range not departing from the concept of the present invention. The components described in the embodiments described above may be combined.

REFERENCE SIGNS LIST 1 radiation interference wave measurement device
11 antenna
12 antenna mast
13 turntable
14 electric wave absorber
15 controller
151 height changing unit
152 azimuth changing unit
20 control unit
201 judgment function
202 correction coefficient calculating function
203 measurement height calculating function
204 first electromagnetic field distribution acquiring function
205 second electromagnetic field distribution acquiring function
210 main control unit
220 input device
230 output device
240 storage device
245 storage medium
250 bus
30 reception unit
100 test body
200 stand

The invention claimed is:

1. A non-transitory computer readable storage medium that stores an electromagnetic wave measurement point calculation program causing a computer to execute steps comprising:
a correction coefficient calculating function of calculating a correction coefficient for which an interval of heights of an antenna satisfies a sampling theorem based on a relative positional relation between a test body including a radiation source radiating a radiation interference wave and the antenna performing measurement of at least one of an electric field and a magnetic field of the radiation interference wave and a reflection coefficient of the radiation interference wave on a floor face on which the test body is placed; and
a measurement height calculating function of sequentially calculating the heights of the antenna in a case in which the measurement is performed using the correction coefficient.

2. The non-transitory computer readable storage medium according to claim 1, wherein the correction coefficient calculating function is a function of calculating the correction coefficient using at least two of a shortest distance between the test body and the antenna in a horizontal direction, a longest distance between the test body and the antenna in the horizontal direction, a shortest distance from the floor face on which the test body is placed to the test body, and a longest distance from the floor face on which the test body is placed to the test body.

3. The non-transitory computer readable storage medium according to claim 2,
wherein the correction coefficient calculating function calculates the correction coefficient using the following Equation (1) or Equations (2) and (3), and
wherein the measurement height calculating function sequentially calculates the heights of the antenna in a case in which the measurement is performed using the following Equation (4)

[Math. 1]

$$K_{hmax}(h_{rx}) = \begin{cases} \dfrac{h_{rx} - h_{min}}{\sqrt{d_{max}^2 + (h_{rx} - h_{min})^2}} - \dfrac{h_{rx} - h_{max}}{\sqrt{d_{min}^2 + (h_{rx} - h_{max})^2}} & (h_{rx} \leq h_{min}) \\ \dfrac{h_{rx} - h_{min}}{\sqrt{d_{min}^2 + (h_{rx} - h_{min})^2}} - \dfrac{h_{rx} - h_{max}}{\sqrt{d_{min}^2 + (h_{rx} - h_{max})^2}} & (h_{min} \leq h_{rx} \leq h_{max}) \\ \dfrac{h_{rx} - h_{min}}{\sqrt{d_{min}^2 + (h_{rx} - h_{min})^2}} - \dfrac{h_{rx} - h_{max}}{\sqrt{d_{max}^2 + (h_{rx} - h_{max})^2}} & (h_{rx} \geq h_{max}) \end{cases} \quad (1)$$

[Math. 2]

$$K_{hmax}(h_{rx}) = \begin{cases} \dfrac{h_{rx} + h_{max}}{\sqrt{d_{max}^2 + (h_{rx} + h_{max})^2}} - \dfrac{h_{rx} - h_{max}}{\sqrt{d_{min}^2 + (h_{rx} - h_{max})^2}} & (h_{rx} \leq h_{min}) \\ \dfrac{h_{rx} + h_{max}}{\sqrt{d_{min}^2 + (h_{rx} + h_{max})^2}} - \dfrac{h_{rx} - h_{max}}{\sqrt{d_{min}^2 + (h_{rx} - h_{max})^2}} & (h_{min} \leq h_{rx} \leq h_{max}) \\ \dfrac{h_{rx} + h_{max}}{\sqrt{d_{min}^2 + (h_{rx} + h_{max})^2}} - \dfrac{h_{rx} - h_{max}}{\sqrt{d_{max}^2 + (h_{rx} - h_{max})^2}} & (h_{rx} \geq h_{max}) \end{cases} \quad (2)$$

[Math. 3]

$$\Delta h_{rx}(h_{rx}) \leq \dfrac{\lambda}{2K_{hmax}} \quad (3)$$

$K_{hmax}$: Correction coefficient
$h_{rx}$: Height of antenna
$d_{min}$: Shortest distance between test body and antenna in horizontal direction
$d_{max}$: Longest distance between test body and antenna in horizontal direction
$h_{min}$: Shortest distance from floor face on which test body is placed to test body
$h_{max}$: Longest distance from floor face on which test body is placed to test body
$\Delta h_{rx}$: Amount of change of height of antenna

[Math. 4]

$$h_{rx,0} = h_{rx\_min}$$

$$h_{rx,1} = h_{rx\_min} + \Delta h_{rx}(h_{rx,0})$$

$$h_{rx,k} = h_{rx,k-1} + \Delta h_{rx}(h_{rx,k-1}) \, (k \geq 2) \quad (4)$$

$h_{rx\_min}$: Minimum value of height of antenna.

4. The non-transitory computer readable storage medium according to claim 3, the program causing the computer to further execute a judgment function of judging whether or not the radiation interference wave reflected on the floor face needs to be taken into account,
wherein the correction coefficient calculating function calculates the correction coefficient using Equation (1) in a case in which it is judged that the radiation interference wave reflected on the floor face does not need to be taken into account.

5. The non-transitory computer readable storage medium according to claim 3, the program causing the computer to further execute a judgment function of judging whether or not the radiation interference wave reflected on the floor face needs to be taken into account,
wherein the correction coefficient calculating function calculates the correction coefficient using Equation (2)

or stops calculation of the correction coefficient in a case in which it is judged that the radiation interference wave reflected on the floor face needs to be taken into account.

6. The non-transitory computer readable storage medium according to claim 3, wherein the correction coefficient calculating function calculates the correction coefficient using Equation (2) regardless of whether or not the radiation interference wave reflected on the floor face needs to be taken into account.

7. The non-transitory computer readable storage medium according to claim 4, the program causing the computer to further execute:
   a first electromagnetic field distribution acquiring function of acquiring a first electromagnetic field distribution that is a distribution of at least one of the electric field and the magnetic field of the radiation interference wave and is acquired through a simulation or actual measurement; and
   a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter,
   wherein the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face does not need to be taken into account in a case in which the deviation is equal to or smaller than a predetermined allowed value.

8. The non-transitory computer readable storage medium according to claim 5, the program causing the computer to further execute:
   a first electromagnetic field distribution acquiring function of acquiring a first electromagnetic field distribution that is a distribution of at least one of the electric field and the magnetic field of the radiation interference wave and is acquired through a simulation or actual measurement; and
   a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter,
   wherein the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face needs to be taken into account in a case in which the deviation exceeds a predetermined allowed value.

9. The non-transitory computer readable storage medium according to claim 4, the program causing the computer to further execute:
   a first electromagnetic field distribution acquiring function of acquiring a first electromagnetic field distribution that is a distribution of at least one of the electric field and the magnetic field of the radiation interference wave and is acquired through a simulation or actual measurement; and
   a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter,
   wherein the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face does not need to be taken into account in a case in which the deviation corresponds to the reflection coefficient that is equal to or smaller than a predetermined threshold.

10. The non-transitory computer readable storage medium according to claim 5, the program causing the computer to further execute:
    a first electromagnetic field distribution acquiring function of acquiring a first electromagnetic field distribution that is a distribution of at least one of the electric field and the magnetic field of the radiation interference wave and is acquired through a simulation or actual measurement; and
    a second electromagnetic field distribution acquiring function of acquiring electric fields or magnetic fields at the heights of the antenna calculated by the measurement height calculating function through a simulation or actual measurement and acquiring a second electromagnetic field distribution acquired by interpolating the electric fields or the magnetic fields at heights of the antenna that are different from the heights of the antenna calculated by the measurement height calculating function using a lowpass filter,
    wherein the judgment function is a function of calculating a deviation between a maximum value of the electric fields or the magnetic fields in the first electromagnetic field distribution and a maximum value of the electric fields or the magnetic fields in the second electromagnetic field distribution and judging that the radiation interference wave reflected on the floor face needs to be taken into account in a case in which the deviation corresponds to the reflection coefficient that exceeds a predetermined threshold.

11. The non-transitory computer readable storage medium according to claim 4, wherein the judgment function is a function of judging that the radiation interference wave reflected on the floor face does not need to be taken into account in a case in which the reflection coefficient, a frequency of the radiation interference wave, and a sampling frequency calculated from a maximum frequency of the radiation interference wave satisfy the following Equation (5).

[Math. 5]

$$-20 \log_{10}\Gamma \geq 24 \cdot f/f_{max} + 16 (0 < f/f_{max} \leq 1) \quad (5)$$

12. The non-transitory computer readable storage medium according to claim 5, wherein the judgment function is a function of judging that the radiation interference wave reflected on the floor face needs to be taken into account in a case in which the reflection coefficient, a frequency of the radiation interference wave, and a sampling frequency calculated from a maximum frequency of the radiation interference wave do not satisfy the following Equation (6).

[Math. 6]

$$-20 \log_{10}\Gamma \geq 24 \cdot f/f_{max} + 16 (0 < f/f_{max} \leq 1) \quad (6)$$

13. The non-transitory computer readable storage medium according to claim 4, wherein the judgment function is a function of judging that the radiation interference wave reflected on the floor face does not need to be taken into account in a case in which an absorption characteristic of the floor face for a frequency of the radiation interference wave of which at least one of an electric field and a magnetic field is measured satisfies the following Equation (7).

[Math. 7]

$$\text{Absorption characteristic (dB)} \geq -20 \log_{10}\Gamma \quad (7)$$

14. The non-transitory computer readable storage medium according to claim 5, wherein the judgment function is a function of judging that the radiation interference wave reflected on the floor face needs to be taken into account in a case in which an absorption characteristic of the floor face for a frequency of the radiation interference wave of which at least one of an electric field and a magnetic field is measured does not satisfy the following Equation (8).

[Math. 8]

$$\text{Absorption characteristic (dB)} \geq -20 \log_{10}\Gamma \quad (8)$$

15. The non-transitory computer readable storage medium according to claim 4, wherein the judgment function is a function of judging that the radiation interference wave reflected on the floor face does not need to be taken into account in a case in which an electric wave absorber, of which a height with reference to the floor face is equal to or larger than a value of a larger one of $0.45\lambda_{min}$ and $2.8\lambda_{max}$, is provided on the floor face.

16. The non-transitory computer readable storage medium according to claim 5, wherein the judgment function is a function of judging that the radiation interference wave reflected on the floor face needs to be taken into account in a case in which an electric wave absorber, of which a height with reference to the floor face is smaller than a value of a larger one of $0.45\lambda_{min}$ and $2.8\lambda_{max}$, is provided on the floor face or in a case in which no electric wave absorber is provided on the floor face.

17. A radiation interference wave measurement device comprising a computer that includes the non-transitory computer readable storage medium according to claim 1.

* * * * *